US008253617B2

(12) United States Patent
Bogaerts

(10) Patent No.: US 8,253,617 B2
(45) Date of Patent: *Aug. 28, 2012

(54) ANALOG-TO-DIGITAL CONVERSION IN PIXEL ARRAYS

(75) Inventor: Jan Bogaerts, Sint Katelijne Waver (BE)

(73) Assignee: Cmosis NV, Antwerp (BE)

( * ) Notice: Subject to any disclaimer, the term of this patent is extended or adjusted under 35 U.S.C. 154(b) by 0 days.

This patent is subject to a terminal disclaimer.

(21) Appl. No.: 12/982,027

(22) Filed: Dec. 30, 2010

(65) Prior Publication Data

US 2011/0095929 A1    Apr. 28, 2011

Related U.S. Application Data

(63) Continuation of application No. 12/388,590, filed on Feb. 19, 2009, now Pat. No. 7,880,662.

(30) Foreign Application Priority Data

Apr. 9, 2008    (GB) .................................. 0806427.1

(51) Int. Cl.
    *H03M 1/56*    (2006.01)
(52) U.S. Cl. ........................................ 341/169; 341/155
(58) Field of Classification Search ........... 341/135–170
See application file for complete search history.

(56) References Cited

U.S. PATENT DOCUMENTS

| 4,786,861 | A  | 11/1988 | Hulsing, II et al. |
| 5,877,715 | A  | 3/1999  | Gowda et al. |
| 6,433,822 | B1 | 8/2002  | Clark et al. |
| 6,453,181 | B1 | 9/2002  | Challa et al. |
| 6,583,817 | B1 | 6/2003  | Lee |
| 6,906,562 | B1 | 6/2005  | Nguyen |
| 7,088,279 | B2 | 8/2006  | Muramatsu et al. |
| 7,091,751 | B2 | 8/2006  | Roh et al. |

(Continued)

FOREIGN PATENT DOCUMENTS

EP    2 048 786 A2    4/2009

OTHER PUBLICATIONS

Lee et al., "High-speed, low-power correlated double sampling counter for column-parallel CMOS imagers", Electronics Letters, Nov. 22, 2007, vol. 43, No. 24, pp. 1362-1364.

(Continued)

*Primary Examiner* — Lam T Mai
(74) *Attorney, Agent, or Firm* — Bacon & Thomas, PLLC

(57) ABSTRACT

An analog-to-digital converter (ADC) generates an output digital value equivalent to the difference between two analog signal values. The ADC receives a first analog signal level, a second analog signal level and a ramp signal. A counter is operable to count in a single direction. A control stage is arranged to enable the counter based on a comparison of the ramp signal with the first analog signal and the second analog signal. A digital value accumulated by the counter during a period when it is enabled forms the output. The ADC can perform the conversion during a single cycle of the ramp signal. The counter can be loaded with a starting digital value representing an exposure level accumulated during a previous exposure period. Techniques are described for reducing the conversion time.

6 Claims, 19 Drawing Sheets

U.S. PATENT DOCUMENTS

| | | |
|---|---|---|
| 7,129,880 B2 | 10/2006 | Tittel |
| 7,129,883 B2 | 10/2006 | Muramatsu et al. |
| 7,283,080 B2 | 10/2007 | Kirsch |
| 7,532,148 B2 | 5/2009 | Muramatsu et al. |
| 7,586,431 B2 | 9/2009 | Muramatsu et al. |
| 7,880,662 B2 * | 2/2011 | Bogaerts .................. 341/169 |
| 2007/0216564 A1 | 9/2007 | Koseki |
| 2011/0221942 A1 | 9/2011 | Taura |

OTHER PUBLICATIONS

Yang et al., "An Integrated 800×600 CMOS Imaging System", IEEE International Solid-State Circuits Conference, 1999, pp. 304-305, 471.

European Search Report issued in corresponding European Application No. EP 09153222, dated Nov. 14, 2011.

* cited by examiner $$\frac{C_B I_A}{C_A I_B} = (2^L + 1)$$

Fig. 24
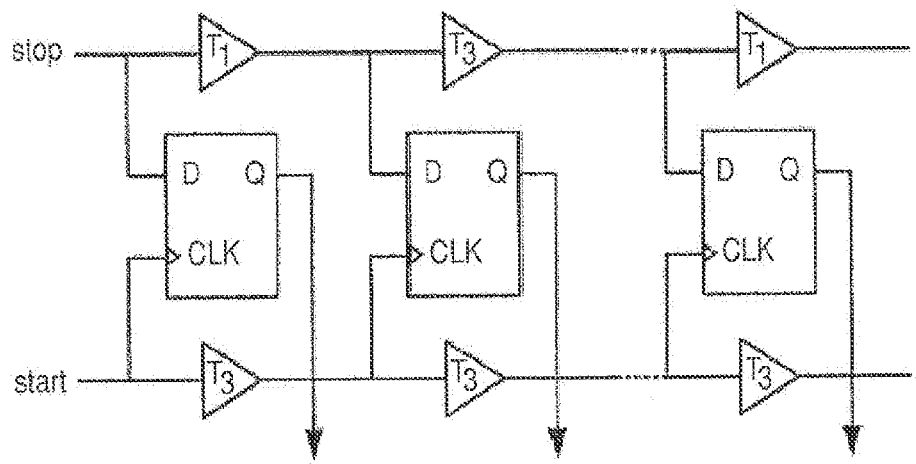
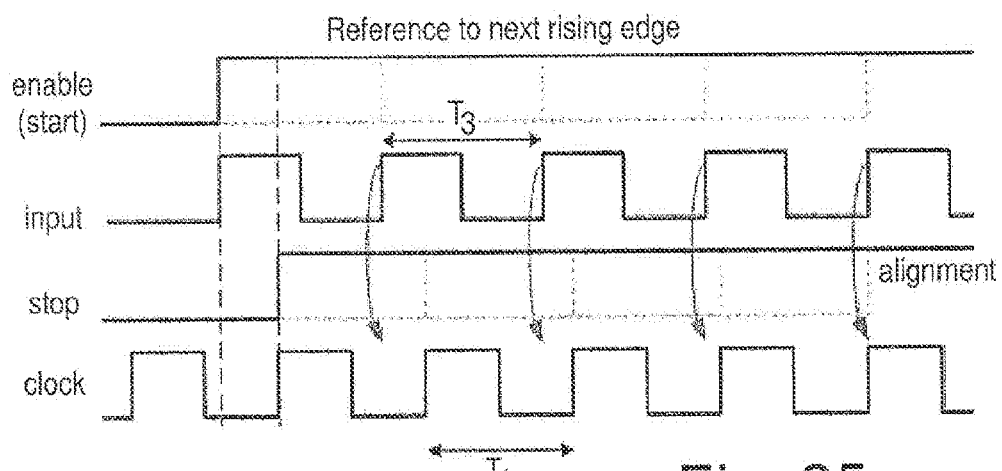
Fig. 25
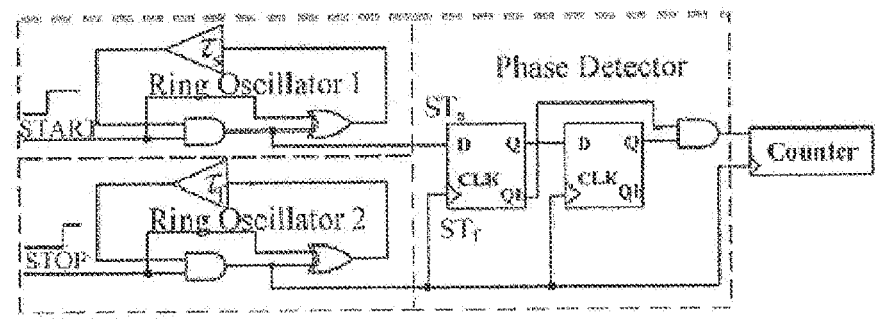
Fig. 26

— 12 + 0 bits
⋯ 10 + 2 bits
--- 8 + 4 bits
-·- 6 + 6 bits

ANALOG-TO-DIGITAL CONVERSION IN PIXEL ARRAYS

CROSS-REFERENCE TO RELATED APPLICATIONS

This application is a continuation of U.S. patent application Ser. No. 12/388,590, filed on Feb. 19, 2009.

FIELD OF THE INVENTION

This invention relates to analog-to-digital conversion which can be used, for example, in processing signals output from a pixel array.

BACKGROUND TO THE INVENTION

Imaging sensors comprise an array of unit elements (pixels). The array of pixels is exposed to radiation during an exposure period and, subsequently, the signal value of each pixel is read from the array. The array can be a one dimensional array (linear sensor) or a two dimensional array (area array) with pixels arranged in rows and columns.

FIG. 1 shows the architecture of a CMOS imaging sensor. Impinging photons are converted into charges in the pixel array and are accumulated during a certain integration period. Typically, the pixels are selected row by row for readout of their signals. A typical 4T pixel is shown in FIG. 2. The pixel includes a photodiode PD, a transfer gate to transfer the charges in the photodiode to the floating diffusion FD, a reset transistor M1, a source follower M2 and a row selection transistor M3. The reset transistor is used to reset the floating diffusion FD to a known state before transferring charge from the photodiode PD to it as is known in the art. The source follower M2 converts the charges stored at the floating diffusion FD into an electrical output voltage signal at the column bus. The useful signal outputs of a pixel are analog voltages representing: (i) the reset signal level $V_{reset}$ and (ii) the signal level $V_{sig}$ that is generated after charge transfer from the photodiode. The final signal that represents the amount of photons impinged onto the pixel is the difference signal between these two signals. In the sensor of FIG. 1, there is sample and hold circuitry 15 associated with each column of the array. During the process of reading the array, the sample and hold circuitry 15 for each column stores the two signal values ($V_{reset}$, $V_{sig}$) for a pixel in a selected row. The two signals, or the difference between these signals, must be converted from an analog value to a digital value. In FIG. 1 the analog-to-digital conversion is performed by a single ADC 16 in the output stage of the array and this single ADC 16 is used, on a time-shared basis, by the column circuits. In turn, signal values are transferred from each of the column circuits to the ADC 16 and converted to digital form.

FIG. 3 shows an alternative approach. Analog-to-digital conversion is performed, in parallel, in each column of the array. The single-slope ADC comprises a ramp generator 20 and a synchronous counter 17. Each column has data latches 18 and a comparator 19. A ramp signal is applied to each of the columns circuits. The ramp signal is distributed to all columns. The counter 17 is incremented in synchronism with the ramp signal such that, at any point in time, the counter 17 provides a digital representation of the analog value of the ramp signal output by the ramp generator 20. The comparator 19 in each column compares the level of the input signal ($V_{reset}$ or $V_{sig}$) against the gradually changing ramp signal. When the ramp voltage reaches the value of the input signal voltage, the comparator 19 output changes state and latches the digital code of the counter into a first memory 18. Afterwards, the same process is repeated for the other of the signals ($V_{reset}$, $V_{sig}$) and the code is latched into a second memory. The difference in digital codes is then sent to the output of the sensor.

A refinement of this arrangement is described in U.S. Pat. Nos. 7,088,279 and 7,321,329 and shown in FIG. 4. The circuitry associated with each column is provided with a dedicated counter 31 which is able to count in a downwards direction and in an upwards direction. When converting the reset signal $V_{reset}$, the counter 31 counts down until the ramp signal reaches the reset level. The direction of counting of the counter 31 is then switched. During the next ramp signal, the counter 31 counts up until the level of the light induced signal $V_{sig}$ is reached. The technique is depicted in FIG. 5. This architecture has some advantages compared to the conventional architecture. In the conventional architecture, the code generated by counter 17 needs to be distributed over the columns. Column-to-column variations of clock skew, which cause conversion error, are generated when a high-speed clock is used. Both reset level and signal level include offset noise from pixel, column circuitry and comparator, the ADC automatically performs the calculation of the difference between the reset and signal values and no additional subtraction circuitry is required. Ripple counters can be used in this architecture because it is unnecessary for them to be synchronized with the high-speed clock. Column-to-column variations of clock skew and counter delay which cause A/D conversion error are corrected for.

Some imaging applications, such as where the light level is low, or where the relative speed of the movement is large, use a technique known as Time Delay and Integration (TDI) to scan a subject and to integrate multiple exposures of the same portion of the subject. TDI typically performs integration in the analog domain. U.S. Pat. No. 7,129,509 describes an imaging system for performing TDI in which an output signal from a column of a pixel array is first converted to digital form and then added to a value which has been stored in digital memory. Although accumulation in the digital domain can have some advantages, the technique described in U.S. Pat. No. 7,129,509 requires a separate storage register and adder to perform the addition of the digital value representing the latest exposure level of an element of the pixel array, with a previously stored value. This can be expensive in terms of area and layout in a semiconductor device.

It is desirable that the analog-to-digital conversion occurs as quickly as possible. The rate at which the ADC can operate is limited by several constraints. A significant constraint is the period of the ramp signal against which the analog reset level and signal level are compared. The gradient of the ramp signal $V_{ramp}$ signal can be increased but, for a given resolution (number of bits), it is necessary to proportionally increase the frequency of the master clock that is distributed to the counters in the column processing units. In practice, there is a limit to the clock frequency that can be achieved.

The present invention seeks to provide an alternative way of performing analog-to-digital conversion.

SUMMARY OF THE INVENTION

A first aspect of the present invention provides an analog-to-digital converter for generating an output digital value equivalent to the difference between two analog signal values comprising:

at least one input for receiving a first analog signal level and a second analog signal level;

an input for receiving a ramp signal;

a counter which is operable to count in a single direction;

a control stage which is arranged to enable the counter based on a comparison of the ramp signal with the first analog signal and the second analog signal;

an output for outputting a value accumulated by the counter during a period when it is enabled.

This aspect of the invention can have an advantage of avoiding the need to distribute a counter signal across multiple ADC units, which improves the accuracy of the accumulated value. It can also avoid the need for counter direction changing circuitry as each counter is only required to count in a single direction.

The analog-to-digital converter performs the conversion during a conversion cycle. The conversion cycle can make use of a ramp signal having two cycles, or just a single cycle. The use of a single ramp cycle can reduce the conversion time as both of the analog signals are compared with the same cycle of the ramp signal. The comparison of the first and second analog signals with the ramp signal can occur concurrently or sequentially during the ramp signal. The control stage can use an intentional offset during the comparisons of the first and second analog signals with the ramp signal.

The value accumulated by the counter can be output directly, or the analog-to-digital converter can comprise an inversion function for inverting the value of the counter.

Advantageously, the control stage is arranged to enable counter circuitry based on a comparison of the analog ramp signal with the first analog signal and the second analog signal, and the counter circuitry comprises:
 a first counter which is arranged to accumulate a digital count value representing an integer number of clock cycles;
 a second counter which is arranged to accumulate a digital count value representing a fractional number of clock cycles.

Advantageously, the comparison of the ramp signal with the first analog signal and the second analog signal produces a pulsed signal which is asynchronous with respect to the clock signal and wherein:
 the first counter is arranged to accumulate a digital count value representing an integer number of complete clock cycles occurring during the duration of the pulsed signal;
 the second counter is arranged to accumulate a digital count value representing a fractional number of clock cycles occurring during a period between an edge of the pulsed signal and a predetermined point which is synchronous with the clock signal.

Advantageously, the control stage is arranged to translate the period between an edge of the pulsed signal and a predetermined point which is synchronous with the clock signal into a longer period which is measurable by the second counter using the clock signal.

A further aspect of the invention provides an analog-to-digital conversion apparatus comprising: a plurality of the analog-to-digital converters arranged in parallel; and a signal generator for generating the ramp signal, wherein the signal generator provides the ramp signal input to each of the plurality of converters.

Advantageously, the analog-to-digital conversion apparatus comprises a storage element for the first analog signal level and a storage element for the second analog signal level.

A second aspect of the present invention provides a processing unit for a pixel array, the processing unit being arranged to accumulate digital signal values for elements of an image over multiple exposure periods and comprising an analog-to-digital converter (ADC) for generating an output digital value equivalent to an analog signal value derived from a pixel of the pixel array, wherein the analog-to-digital converter comprises:
 an input for receiving an analog signal level;
 an input for receiving a ramp signal;
 a counter;
and the processing unit comprises a control stage which is arranged to enable the counter based on a comparison of the ramp signal with the analog signal level and to begin the counter at a starting digital value which represents a previously accumulated exposure level for an element of the image.

This aspect of the invention is particularly advantageous in Time Delay and Integration (TDI) applications and any application where multiple values need to be accumulated. Initialising the counter in the ADC to the previously accumulated value allows accumulation without the need for a separate adder, which can provide a considerable saving in semiconductor area and layout.

A counter can be allocated to accumulate the digital signal value for a particular element of the image across the multiple exposure periods. Alternatively, an ADC can be associated with a pixel, or line of pixels, of the pixel array with an accumulated digital value being held in a memory and loaded into the counter as the starting digital value at the start of a processing operation for each exposure period.

Advantageously, the processing unit monitors the accumulated digital value and determines if any further processing operations should occur. This determination can be based on the current accumulated exposure level. Operating in this manner makes it possible to prevent saturation of image elements, before saturation occurs. The determination can be made independently for each accumulated element of the image.

Advantageously, if the processing unit determines that no further processing operations should occur, the control stage causes the number of exposure periods for which accumulation has occurred to be stored in the memory.

A third aspect of the present invention provides a processing unit for a pixel array, the processing unit comprising an analog-to-digital converter for generating an output digital value equivalent to an analog signal value derived from a pixel of the pixel array, wherein the analog-to-digital converter comprises:
 an input for receiving the analog signal value;
 an input for receiving a ramp signal;
 an input for receiving a clock signal;
and the processing unit further comprises a control stage which is arranged to enable counter circuitry based on a comparison of the analog ramp signal with the analog signal value, the counter circuitry comprising:
 a first counter which is arranged to accumulate a digital count value representing an integer number of clock cycles;
 a second counter which is arranged to accumulate a digital count value representing a fractional number of clock cycles.

This aspect of the invention can have an advantage of increasing speed of conversion in the ADC without requiring a high speed clock signal.

Advantageously, each of the aspects of the invention is applied to the processing of analog output signals from a pixel array. The analog-to-digital converter can be used to process an output of a pixel or a group of pixels (e.g. a column) of the pixel array. The analog signal levels can correspond to a reset level of a pixel and a signal value of the pixel following exposure to radiation.

Advantageously, a plurality of the analog-to-digital converters are arranged in parallel. Each analog-to-digital converter receives the same ramp signal as an input. Each ADC is associated with a pixel (e.g. linear 1D array) or a line of pixels of the pixel array.

The analog-to-digital converter, or parallel set of ADCs, is advantageously provided on the same semiconductor device (e.g. integrated circuit) as a pixel array, although the analog-to-digital converter, or set of ADCs, can be provided on a separate semiconductor device. The analog-to-digital converter can be also used in a 3D integrated sensor. A 3D integrated sensor is a sensor that is built up from multiple chips that are stacked on top of each other. For example, a first chip contains the pixel photodiodes or pixel circuitry. This chip is bonded to a second chip containing readout circuitry (e.g. analog processing circuits or ADCs) and so on.

The invention also provides a corresponding method for each of the aspects of the invention.

Features of the first, second and third aspects of the present invention can be combined with one another. For example, the first aspect of the invention can make use of the features of the third aspect of the invention to improve conversion speed.

BRIEF DESCRIPTION OF THE DRAWINGS

Embodiments of the invention will be described, by way of example only, with reference to the accompanying drawings in which:

FIGS. 24 to 29 show a third way of implementing the scheme of FIG. 16;

DESCRIPTION OF PREFERRED EMBODIMENTS

Figure 1:
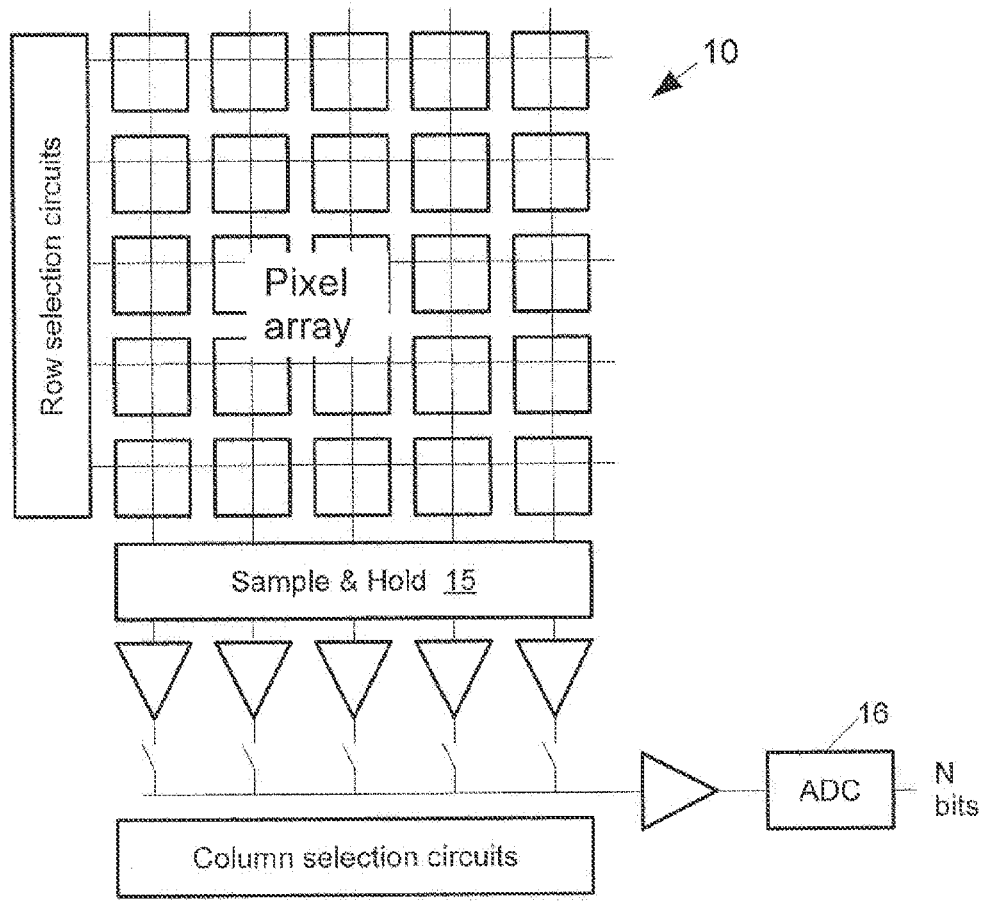
FIG. 1 shows a known architecture of an imaging sensor comprising a pixel array, a column circuit for each column of the pixel array and a single output ADC.
Figure 2:
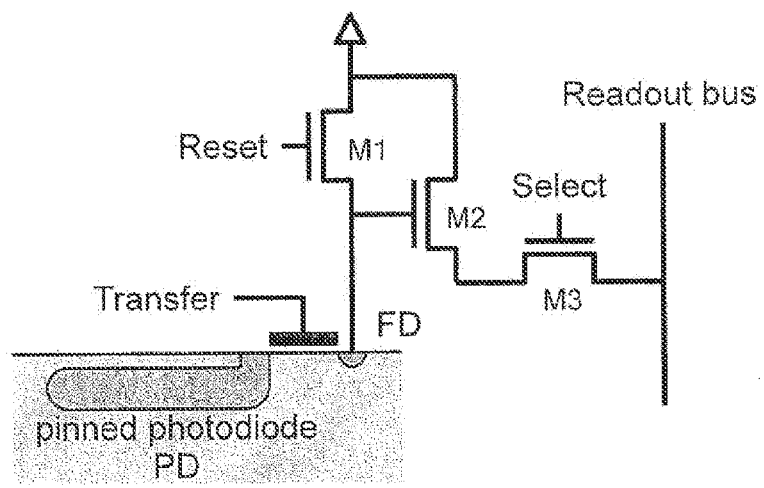
FIG. 2 shows a four transistor (4T) active pixel sensor for use in the array of FIG. 1.
Figure 3:
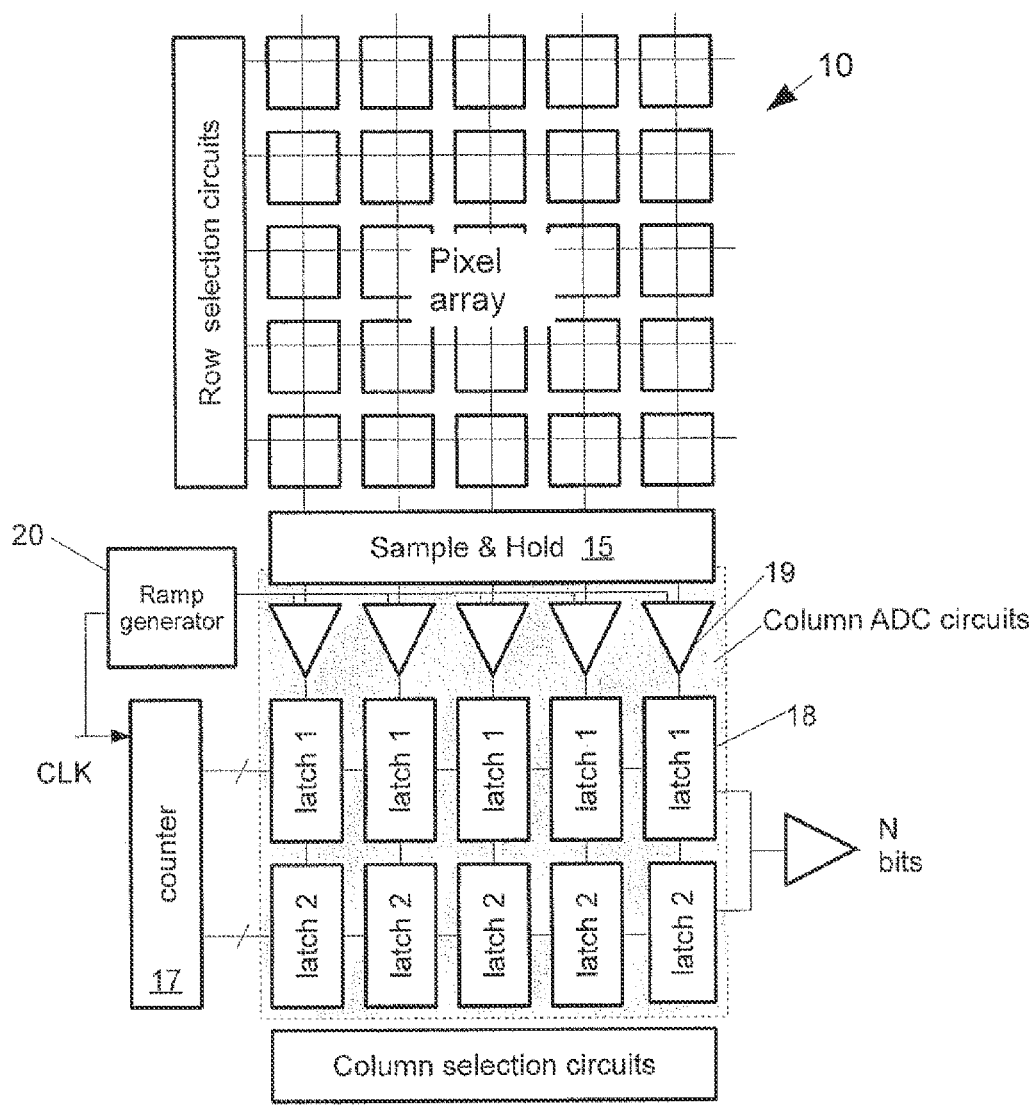
FIG. 3 shows an alternative known architecture of an imaging sensor comprising a pixel array and a column circuit for each column of the pixel array, where analog-to-digital conversion is performed in each column circuit using a ramp signal and a counter which are distributed to each column circuit.
Figure 4:
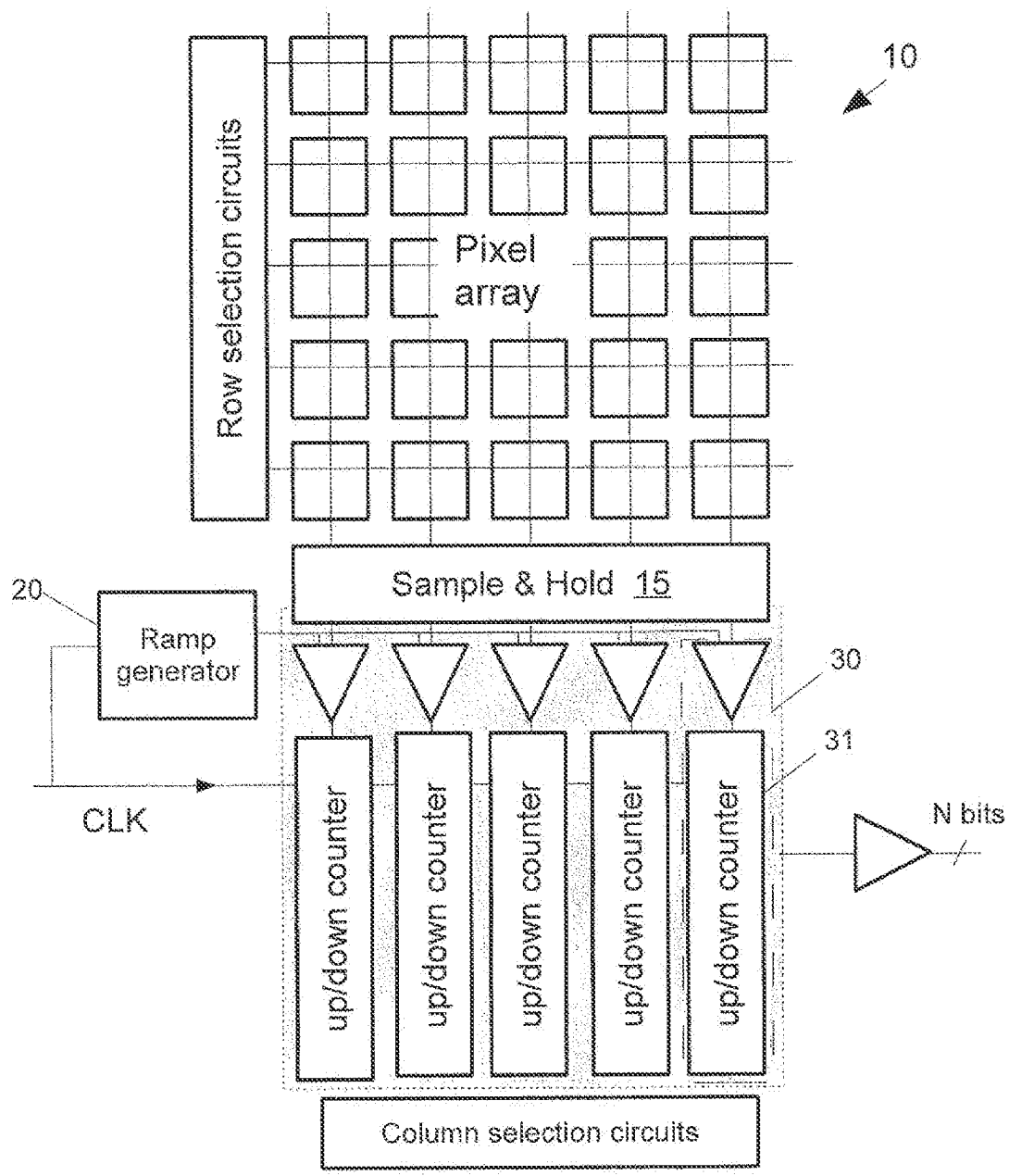
FIG. 4 shows an alternative known architecture of an imaging sensor comprising a pixel array and a column circuit for each column of the pixel array, where analog-to-digital conversion is performed in each column circuit using a distributed ramp signal and a counter in each column circuit which counts in both downward and upward directions.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Throughout this specification, it should be noted that the term "row" and "column" can be interchanged. Also, the term "row" does not imply a particular orientation of the array.

Single Direction Counter

Figure 6:
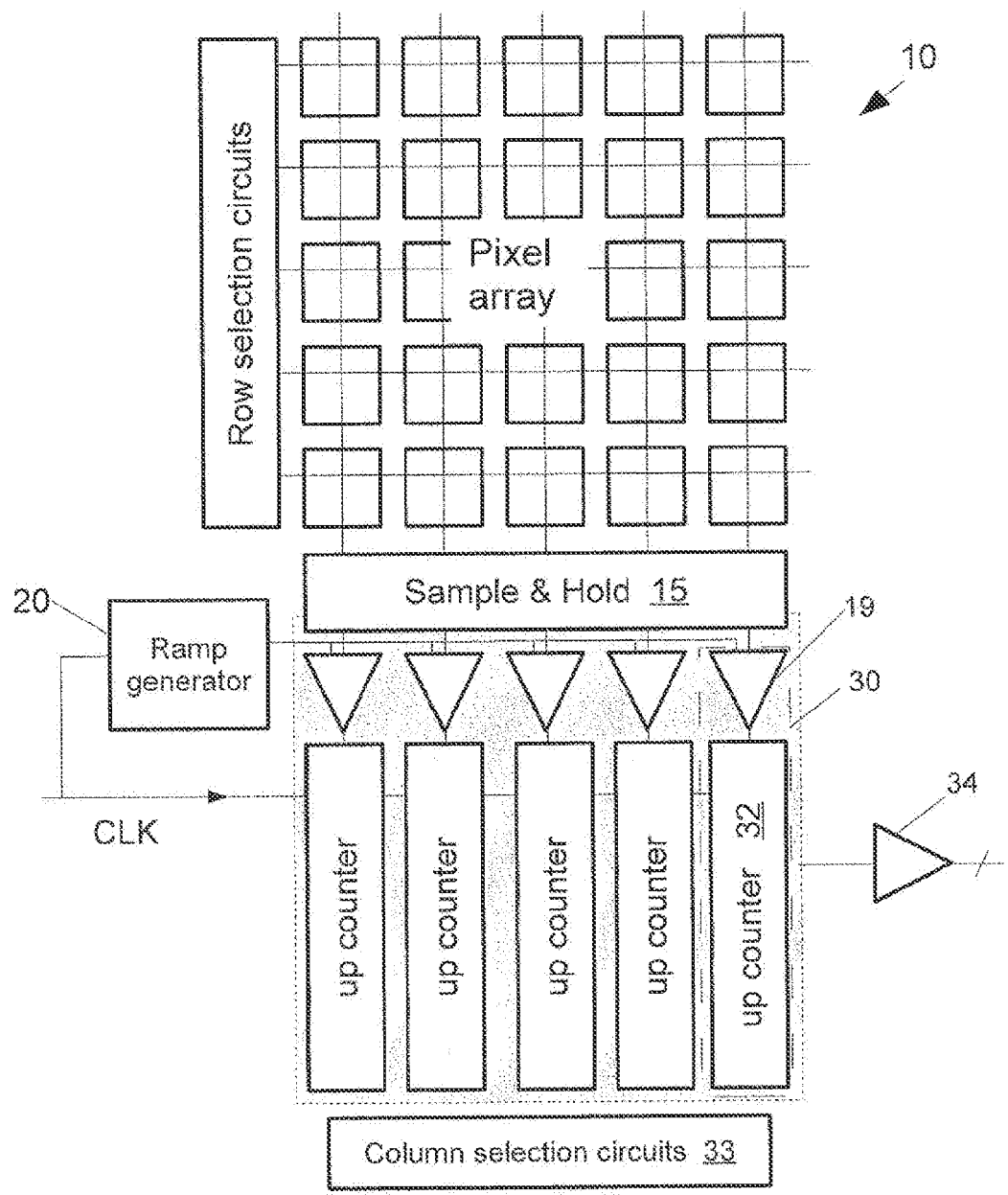
FIG. 6 shows an architecture of an imaging sensor according to an embodiment of the present invention where analog-to-digital conversion is performed in each column circuit using a distributed ramp signal and a counter in each column circuit which counts in a single direction.
Figure 7:
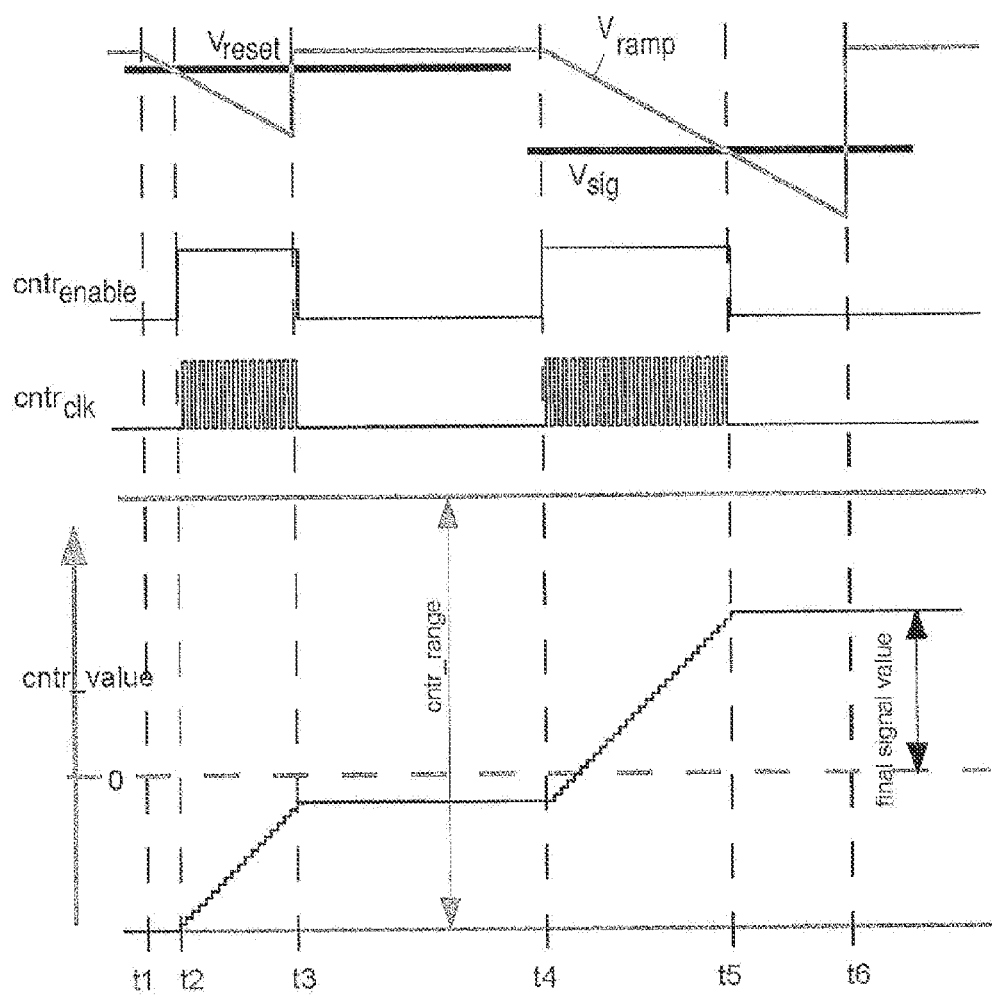
FIGS. 7 and 8 show operation of the column circuit of FIG. 6 to derive a digital count value corresponding to a difference between two analog signal values.
Figure 8:
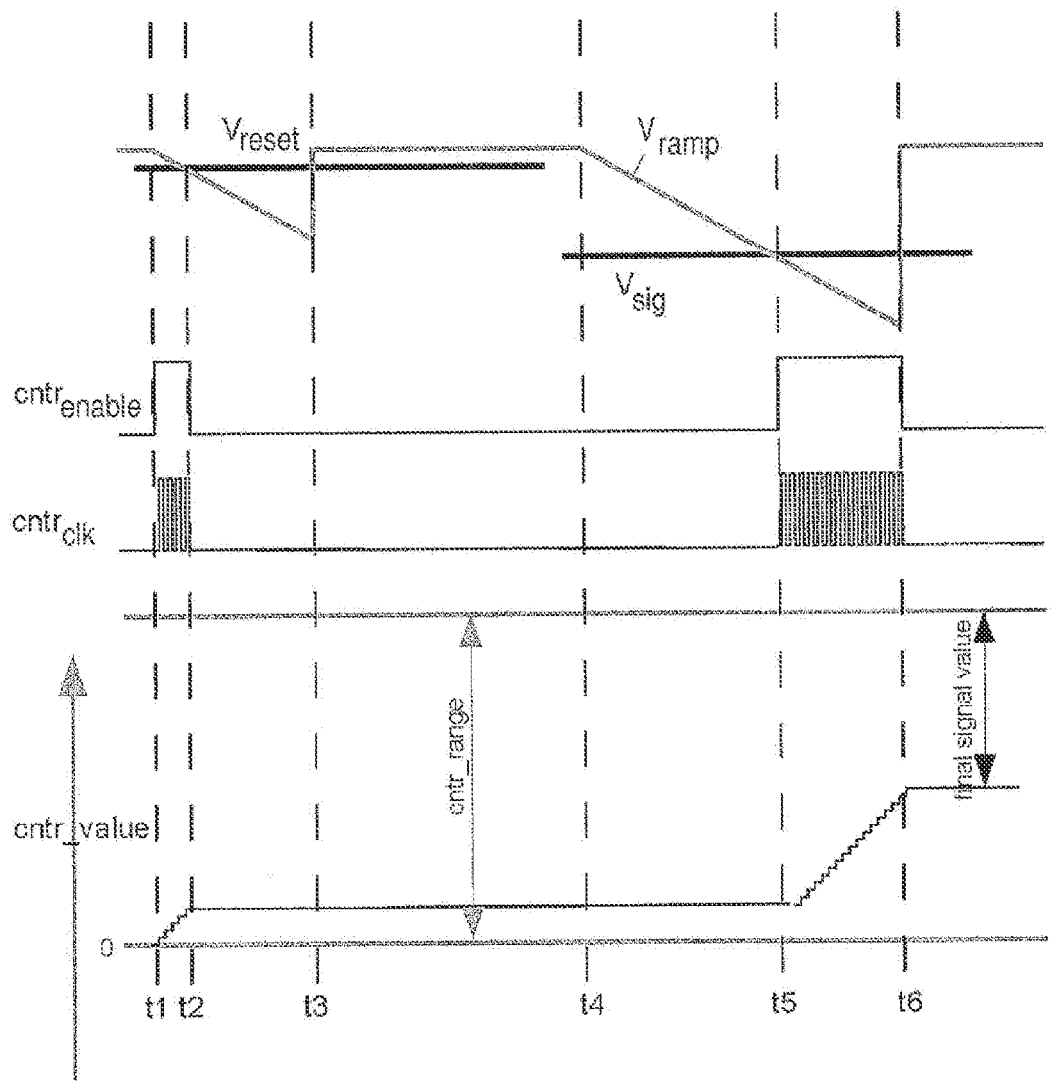

FIG. 6 shows an architecture of a sensor which includes column processing stages to perform double sampling, or correlated double sampling (CDS), in accordance with an embodiment of the present invention, and FIGS. 7 and 8 show two alternative ways in which the column processing stages 30 of FIG. 6 can operate. Each of the parallel set of column processing stages 30 comprises a comparator 19 and a unidirectional counter 32. The use of a unidirectional counter avoids the need for any circuitry to change the direction of counting. A ramp generator 20 generates a ramp signal which is distributed to each column processing stage 30. A clock signal CLK is also distributed to each column processing stage 30. Comparator 19 receives the ramp signal on one of the comparator inputs. Each of the signals ($V_{reset}$, $V_{sig}$) held by the sample and hold circuitry 15 is sequentially applied to the other comparator input. The comparator 19 enables counter 32 based on the comparison of the input signals ($V_{reset}$, $V_{sig}$) with the ramp signal. At the end of a processing operation, counter 32 holds a count value which is representative of the difference between the two analog signals ($V_{reset}$, $V_{sig}$). Column selection circuits 33 selectively transfer, on a time-shared basis, the digital values held by counters 32 to the output 34.

Figure 5:
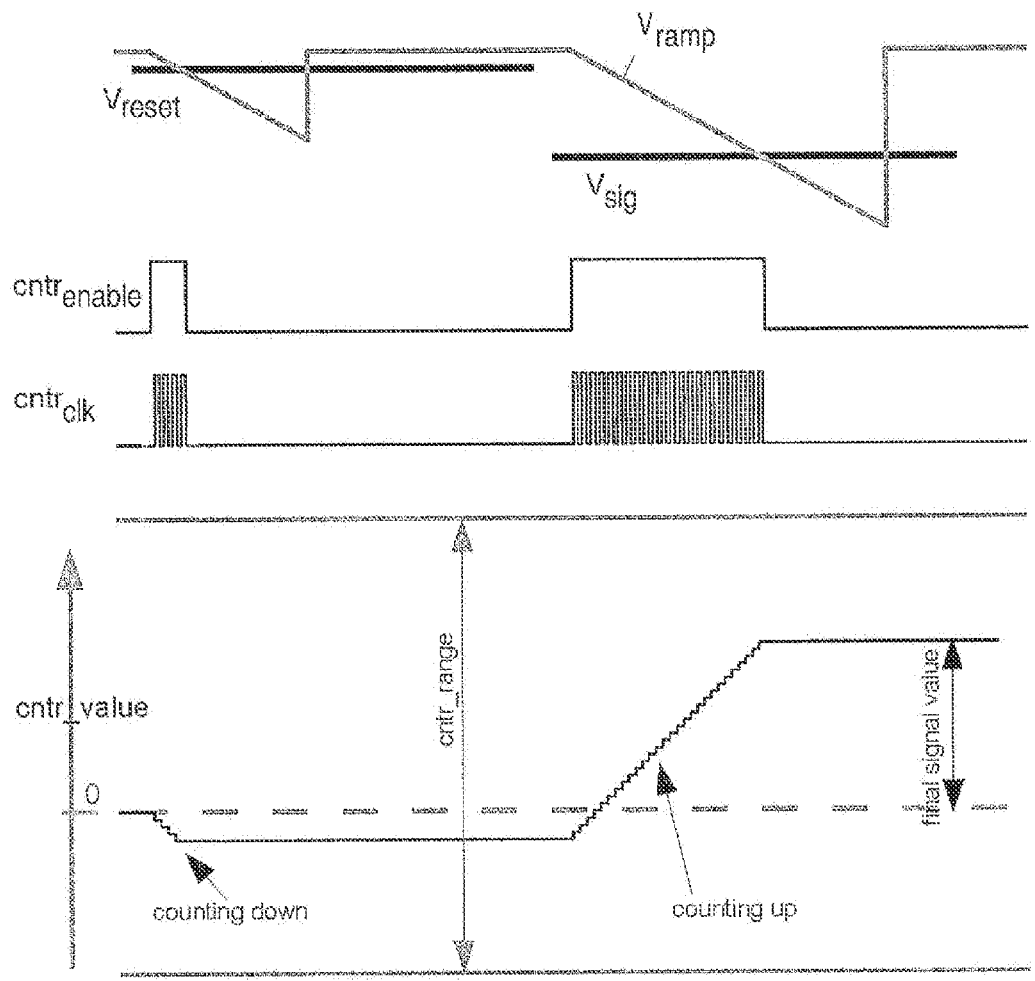
FIG. 5 shows operation of the column circuit of FIG. 4 to derive a digital count value corresponding to a difference between two analog signal values.

The first operating scheme is shown in FIG. 7. During a first operating phase the reset level $V_{reset}$ is compared with the ramp signal. The ramp signal begins at time t1. The counter begins at time t2 when the ramp signal equals the reset level $V_{reset}$ and the counter is stopped at time t3 at the end of the ramp. During a second operating phase the signal level $V_{sig}$ is compared with the ramp signal. The ramp signal begins at time t4. The counter is also restarted at the same time, t4, and continues to count in the same direction from the value accumulated at time t3. The counter is stopped at time t5 when the ramp signal equals the signal level $V_{sig}$. The ramp signal ends at time t6. By comparing FIGS. 5 and 7 it can be seen that the final counter value is the same using both methods, taking into account that the reference level (0) is equal to the code corresponding to the first ramp signal range (the result when $V_{reset}$ equals $V_{sig}$).

The second operating scheme is shown in FIG. 8 and this is essentially an inverse of the operation shown in FIG. 7. During a first operating phase the reset level $V_{reset}$ is compared with the ramp signal. The ramp signal begins at time t1 and the counter also begins at t1. At time t2, when the ramp signal equals the reset level $V_{reset}$, the counter is stopped. The ramp signal ends at time t3. During a second operating phase the signal level $V_{sig}$ is compared with the ramp signal. The ramp signal begins at time t4. At time t5, when the ramp signal equals the signal level $V_{sig}$, the counter is restarted, and continues to count in the same direction from the value accumulated at time t2. At time t6 the ramp signal ends and the counter is stopped. The final counter value corresponds in this case to the 'inverse' signal (counter value is maximum for small signals). The final counter value can be converted by a simple conversion technique. In general, a linear conversion can be used, of the form: "final_sig_value=cntr_range−cntr_value". If the cntr_range is not fixed, an adder (subtraction) is required at the output. For a fixed cntr_range, the adder circuit reduces to a simple logic operation. For certain values (typically used), it is a very simple operation, e.g. in case of 5 bit conversion and taking cntr_range="11111", for cntr_value="00101" (example), the final result is "11010" (meaning each digit is simply inverted).

In FIGS. 7 and 8 it can be seen that the ramp signal has a smaller amplitude range, and a shorter period, in the first phase of the operating cycle compared to the second phase of the operating cycle. This is possible because the range of reset levels (including pixel, column and comparator offsets and noise) is considerably smaller than the range of the signal representing an exposure level of a pixel. Providing a ramp signal with two different ranges and/or periods, helps to reduce the overall length of the conversion cycle.

Single Ramp Cycle

In the techniques described above the double sampling operation requires two separate phases of a conversion cycle, with the ramp signal being reset between the two phases. During a first phase of the conversion cycle the reset level $V_{reset}$ is compared with the ramp signal, and then in a second phase of the conversion cycle the signal level $V_{sig}$ is compared with the ramp signal. In a further embodiment of the invention, the conversion cycle has a single phase with a single ramp signal and both the reset level $V_{reset}$ and the signal $V_{sig}$ are compared with the same ramp signal.

Figure 9:
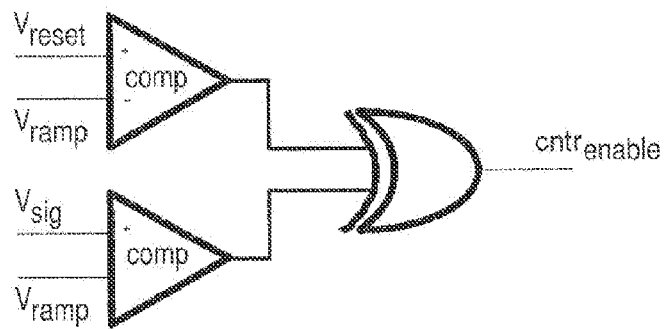
FIG. 9 shows comparison logic for use with the column circuit of FIG. 6 to derive a digital count value corresponding to a difference between two analog signal values with a single ramp cycle.
Figure 10:
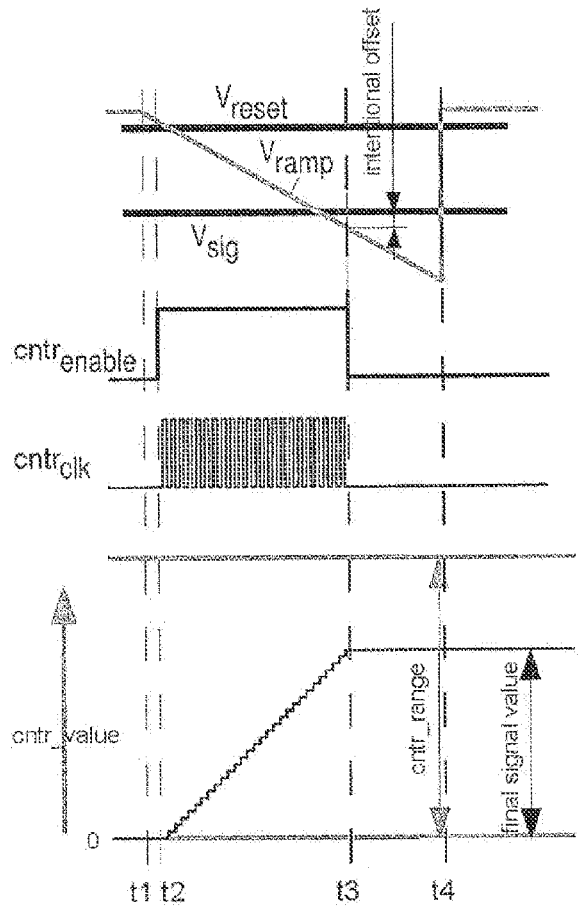
FIG. 10 shows operation of the column circuit of FIG. 6 to derive a digital count value corresponding to a difference between two analog signal values with a single ramp cycle.

Two techniques will be described. The two signals to be converted (or the difference between these two signals) are made available concurrently, e.g. by sample and hold circuitry 15 at the output of the column. The first technique, shown in FIGS. 9 and 10, uses comparison logic which is capable of comparing both the reset level $V_{reset}$ and the signal $V_{sig}$ with the ramp signal. The comparison logic can comprise a comparator with three inputs or, as shown in FIG. 9, it can comprise two comparators each having two inputs and an exclusive OR gate. As shown in FIG. 10, the ramp signal starts at time t1 and ends at time t4. When the ramp signal equals the reset level $V_{reset}$, at time t2, the counter is enabled and stays enabled until the ramp signal equals the signal level $V_{sig}$, at time t3. Actually, the comparison is not an exact comparison of the levels, but includes a systematic offset of at least 1 clock period for the case that the signal level equals the reset level (i.e. for net zero input, the enable signal for the counter is at least 1 clock period long). This is advantageous to ensure that all random variations of the comparators (in the columns) can be measured, i.e. the systematic offset is larger than the largest possible random offset such that the counter value is larger than zero for net zero input. The systematic offset can also be ensured by using an offset in the $V_{ramp}$ generation of one of the comparators. These systematic offsets (and random variation of this systematic offset) can then be calibrated and stored periodically (e.g. each frame or at start up of the sensor) by setting signal equal to reset signal and storing the result which is then systematically subtracted from each measurement (could be only a few bits, subtraction at output or during initialization of the counters).

Figure 11:
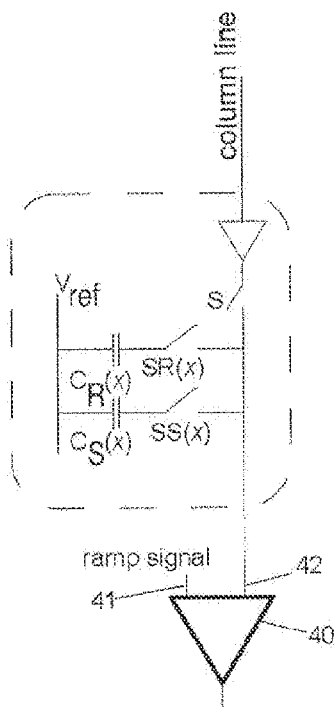
FIG. 11 shows an input stage for the column circuit of FIG. 6 which is an alternative to that shown in FIG. 9.
Figure 12:
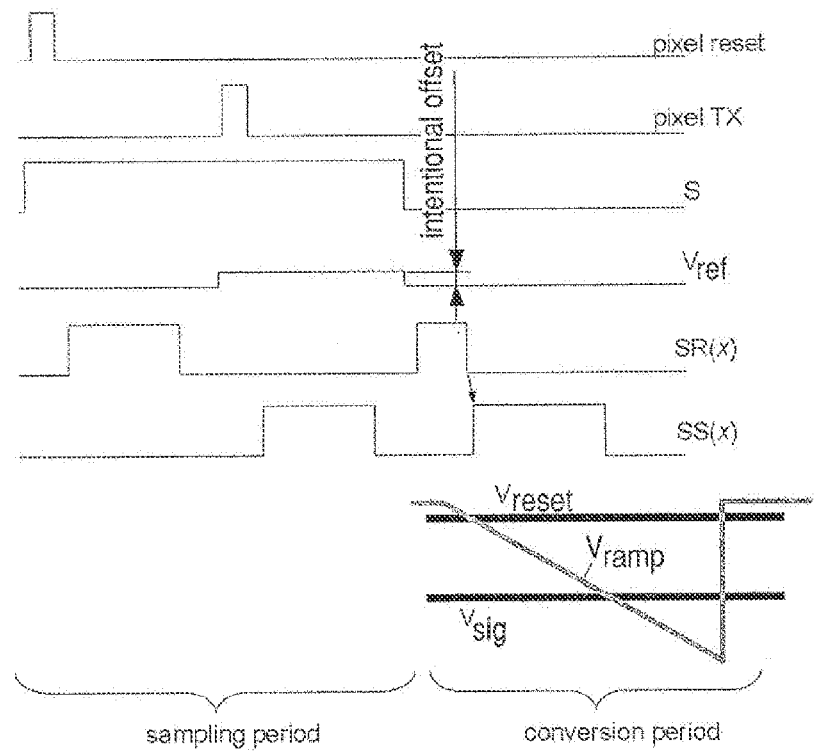
FIG. 12 shows operation of a column circuit having the input stage of FIG. 11 to derive a digital count value corresponding to a difference between two analog signal values with a single ramp cycle.

The second technique is schematically depicted in FIGS. 11 and 12. Sample & hold capacitors $C_R(x)$, $C_S(x)$ store the reset level and the signal level of a pixel in the pixel array. A single comparator 40 is used within the column processing stage 30. A first input 41 of comparator 40 receives the ramp signal and the second input 42 of comparator 40 receives one of the sampled signals held on capacitors $C_R(x)$, $C_S(x)$. At the start of the conversion cycle, comparator input 42 is connected to the first capacitor $C_R(x)$ that is storing the reset level. Once the ramp signal reaches the reset level, the comparator input 42 is disconnected from this first capacitor $C_R(x)$, and connected to the second capacitor $C_S(x)$ which is storing the signal level including an offset. During sampling of the reset and signal level onto the sample and hold capacitors $C_R(x)$, $C_S(x)$, an intentional offset is used on the reference signal. This helps to ensure that all random variations in case of small signals are converted. The intentional offset is required as a comparator always has a certain random offset (e.g. mismatch of transistors, threshold voltages, etc.) i.e. the comparator switches state when $V_{ramp} = V_{comp\_input} + V_{offset}$ (where $V_{offset}$ can be positive or negative). If no intentional offset is provided for one of the two comparators then, for small signals, the comparator connected to $V_{sig}$ can already be switched before the comparator connected to $V_{reset}$ switches. In that case, the conversion is wrong. In the second technique (FIG. 12), the intentional offset is required because switching the input from $V_{reset}$ to $V_{sig}$ takes some time (while the ramp signal is continuously changing).

Calibration measures the random variations of the introduced systematic offset (offsets, unique for each device) such as by performing a conversion with $V_{sig} = V_{reset}$ and storing this measurement (or readout). This is used as a reference measurement. The stored values can be subtracted on-chip (e.g. at the output or by proper initialization of the counters) or off-chip. The calibration does not need to be performed each row, but can be performed only from time to time.

Application to Time Delay and Integration (TDI)

Figure 13:
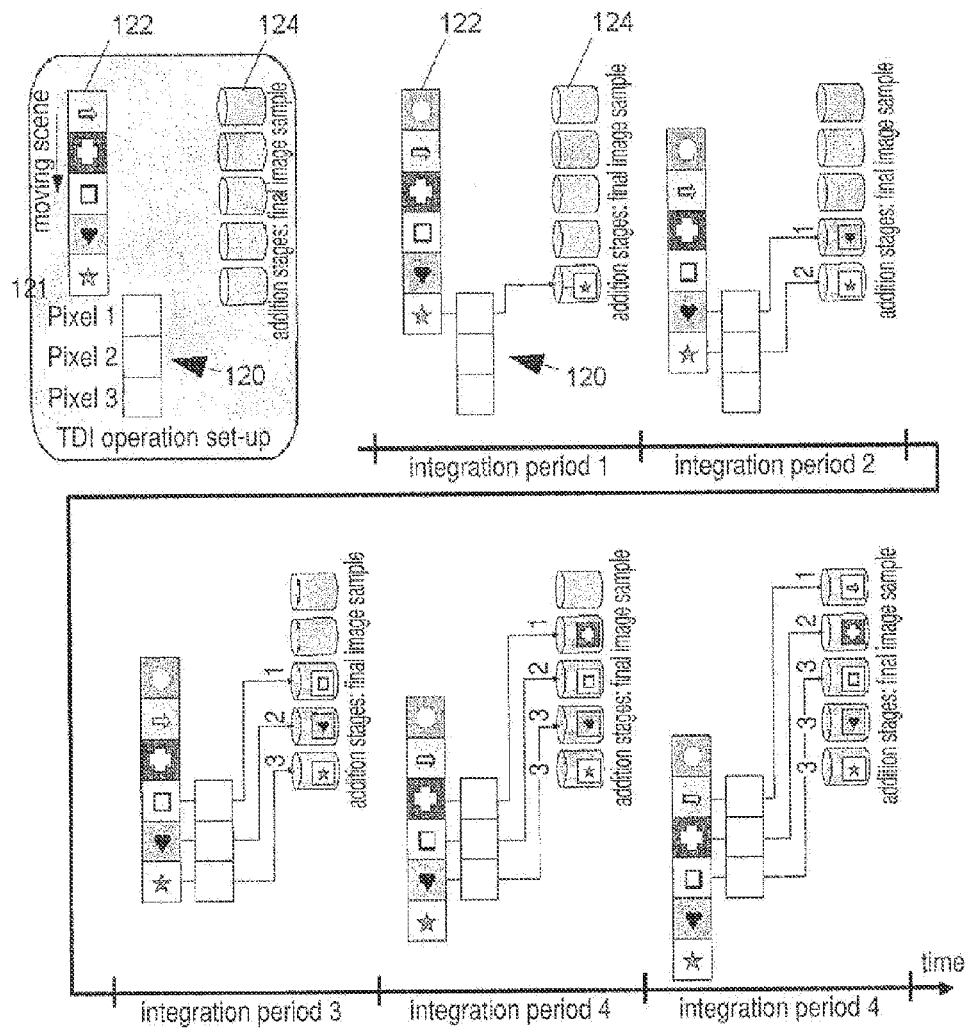
FIG. 13 schematically shows time delay and integration (TDI)

The approach of using a column ADC with ramp and counter is well suited for TDI applications (Time Delay and Integration). By way of background, a Time Delay and Integration (TDI) imaging process will now be described. In line scan applications where the light level is low, or where the relative speed of the movement is large, Time Delay Integration (TDI) image sensors are useful. The pixel signals delivered by the pixels of the same column (along-track direction) are in that case adequately delayed and added synchronously with the optical scanning. Thus, the light from a given point in the scene impinges successively on each pixel of the given corresponding column. As the light of the scene impinges on each row in succession, the signals from each of the rows are added to increase the final SNR. A simple example of the TDI principle is illustrated in FIG. 13. A 1D image sensor comprising a column of pixels (Pixel 1, pixel 2, pixel 3) 120 is shown. A subject 122 is moved past the image sensor 120 in the direction 121. Five separate integration periods are shown. During the first integration period, the first element of subject 122 is detected by pixel 1 of the sensor 120 and stored in a first storage device of processing circuitry 124, which can be located on or off-chip. During the second integration period, the first element of subject 122 is detected by pixel 2 of the sensor 120 and is summed (integrated) with the previously stored copy of the same element in the first storage device of processing circuitry 124 (which now shows a count of "2"). In addition, the second element of subject 122 is detected by pixel 2 of the sensor 120 and is stored in a second storage device of processing circuitry 124. The process continues over subsequent integration periods, with each storage device in processing circuitry 124 accumulating multiple detected copies of the same elements of subject 122.

Figure 14:
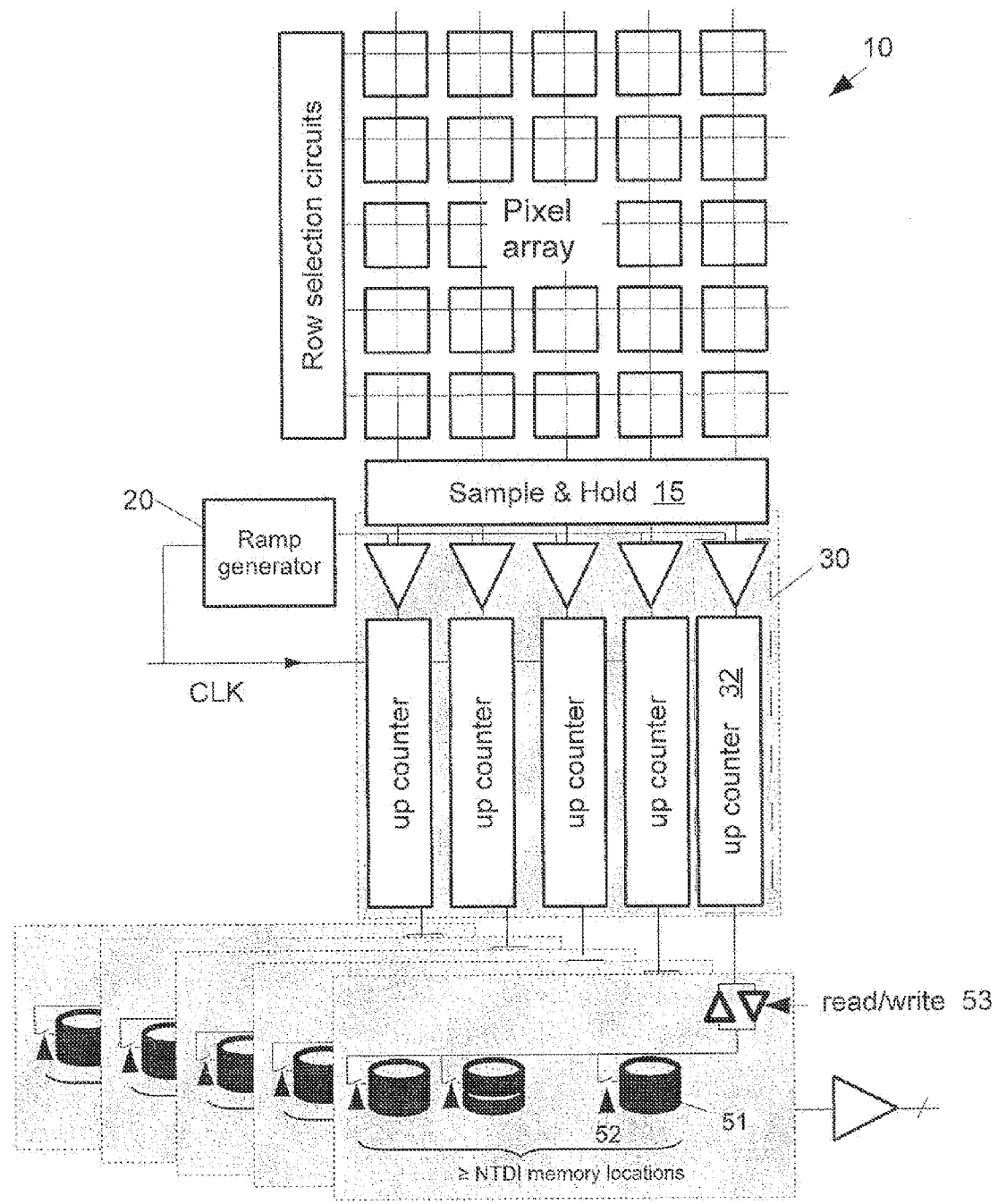
FIG. 14 shows the imaging sensor of FIG. 6 adapted to perform TDI.

To achieve the TDI functionality, a number of accumulation circuits are required. Accumulation in the digital domain is simpler than in the analog domain, which has conventionally been used for TDI. Two schemes will be described. A first scheme uses a single counter in combination with a memory array (e.g. DRAM like). FIG. 14 shows the image sensor of FIG. 6 with additional apparatus to perform TDI. As previously described, the image sensor comprises a pixel array 10 with an output per column. Sample & hold stages 15 are not always required, depending on the readout timing. Each column has a column processing unit 30 which includes a comparator and a counter 32. Each column processing unit 30 is associated with a set of storage locations 51 which are accessible by the column processing unit 30. A bus connects the column processing unit 30 to the storage locations 51. A read/write control signal 53 controls direction of flow of data between a storage location 51 and a counter 32, and a switch 52 at each storage location determines which storage location is used to store a counter value, or determines from which storage location an accumulated value is read. Prior to each pixel signal accumulation, the counter 32 in a column processing unit 30 is initialised with an accumulated signal value stored in a memory location. Counter 32 then begins to count in the manner described in any of FIG. 5, 7 or 8, with the difference that the count begins at the value loaded from the storage location (and representing the accumulated value over previous TDI integration cycles). The counter 32 is incremented according to the reset and signal values ($V_{reset}$, $V_{sig}$) for the currently selected pixel. When the addition process is finished the counter value is written to the appropriate memory location. The memory location of a TDI pixel (=accumulated signal) can be fixed, with the data of the counter being written into the same memory location on each occasion, or the location of the TDI pixel can shift through the memory array. In the first case, the memory is read out in a rolling readout sequence (readout pointer required). In the latter case, the last memory location (holding the fully accumulated TDI signal) always has to be read out.

A second scheme adds a new pixel signal to an already accumulated signal by choosing and incrementing the appropriate counter in the A/D conversion process. There is an array of counters and logic routes the new signal to the correct counter and the counters themselves act as memories in this case. A counter comprises a number of flip flops and is thus able to store the signal, as it behaves in a similar manner to static memory. The enable signal, clock signal and ramp signal are routed to the correct counter.

This aspect of the invention can use a single direction counter with a single ramp cycle, or two ramp cycles. It can alternatively use a counter with up/down counting as described in U.S. Pat. No. 7,088,279.

Control of Dynamic Range

Figure 15:
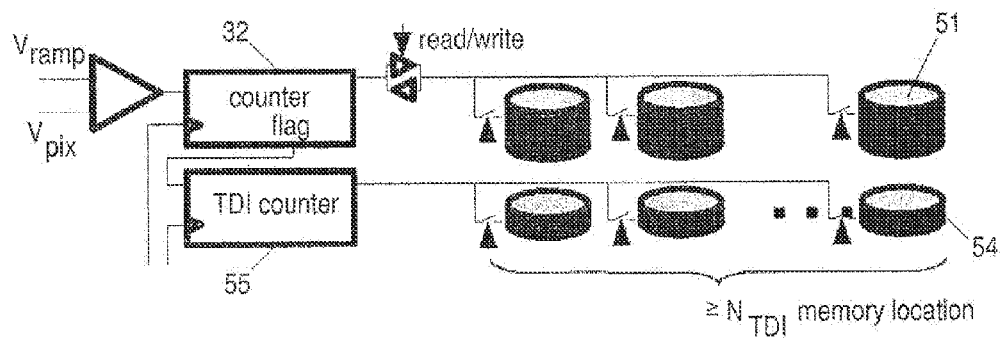
FIG. 15 shows a modification to the imaging sensor of FIG. 14.

In the schemes described above, the dynamic range of a TDI pixel is practically unlimited if the bit depth of the counter is sufficient. Where the bit depth of a counter does impose a limit, the dynamic range of the TDI signal can be controlled as follows. This technique can be applied to TDI sensors as well as to linear sensors (or any other kind of sensor) where a pixel signal value is accumulated by reading a pixel multiple times during a frame period. The principle is illustrated in FIG. 15 for a TDI sensor. The counter shown in FIG. 15 can be the unidirectional counter 32 previously described. As in FIG. 14, a memory location 51 stores an accumulated TDI signal. An additional counter 55 maintains a count of the number of TDI cycles that have been performed. An additional memory location 54 is associated with memory location 51. The additional memory location 54 stores a count of the number of TDI cycles (addition cycles) for which the signal value has been accumulated. After each addition a decision is made as to whether the next addition should take place or not. As an example, if the accumulated counter value stored in memory location 51 exceeds a certain (pre-defined or programmable) value (logic operation in the counter), the addition of the next pixel signal is suppressed and the TDI depth (i.e. the number of TDI cycles, or the number of addition steps up to that point) is memorised. A practical example will now be described. Consider that there are eight TDI cycles and that counter 32 is a 6-bit counter 32. Consider a TDI imaging process of a relatively dark object. Each TDI cycle contributes a signal which increases the counter value by '000011' (as an example). After eight such TDI cycles the final value of counter 32 will be about '011000', resulting from eight additions of approximately the same signal '000011'. The additional memory location 54 will, in this case, indicate '111', as eight TDI cycles were performed without reaching the maximum value of counter 32. Consider now a TDI imaging process of a relatively bright object. Each TDI cycle contributes a signal which increases the counter value by '001011' (as an example). After four such TDI cycles the value of counter 32 is about '101100'. If '100000' is taken as a threshold counter value, this means that any further addition operations are suppressed. The final value of counter 32 remains as '101100' and the additional memory location 54 contains a value '011', meaning that the value held in counter 32 was reached after 4 addition operations. If the TDI process had continued, the final counter value would have been '111111' with no indication of when this value was reached, i.e. a useless saturated signal. In this example, counter 55 can be a 3-bit counter (maximum value="111" indicating that the counter 32 did not saturate; minimum value='000' indicating that saturation occurred within a single cycle; value='001' indicating that saturation occurred after two cycles etc.) The TDI counter value in the second memory location 54 can be incremented at each addition step or, alternatively, the TDI counter value can be written into the second memory location 54 only when it is required. Memory access to memory location 51 is frozen for future additions. This means that each pixel of the final image can have its own optimal TDI level and at the same time use the full dynamic range offered by the accumulator. Typically, the final signal (expressed as bits/s) is equal to 'TDI value/ $T_{int}$', where TDI value is the value accumulated and stored in memory, and $T_{int}$ is the total integration period. In this improvement, the signal for a particular image element is equal to:

$$\text{TDI value}^*/(f \times T_{int})$$

where TDI value* is the accumulated value stored in memory location 51 and f is the fraction of the total integration period, based on the value stored in memory location 54.

This aspect of the invention can use a single direction counter with a single cycle, or two cycles. It can alternatively use a counter with up/down counting as described in U.S. Pat. No. 7,088,279.

Use of Interpolation Technique to Increase Conversion Speed

It is desirable that the analog-to-digital conversion occurs as quickly as possible. The rate at which the ADC can operate is limited by several constraints. A significant constraint is the period of the ramp signal ($V_{ramp}$ in FIG. 7) against which the analog reset level and signal level are compared. The gradient of the ramp signal $V_{ramp}$ signal can be increased but, for a given resolution (number of bits), it is necessary to proportionally increase the frequency of the master clock that is distributed to the counters in the column processing units 30. In practice, there is a limit to the clock frequency. The conversion time:

$$T_{conversion} = 2^N \times T_{clock}$$

with N is the number of wanted bits and $T_{clock}$ is the master clock period. A technique will now be described which allows the same, or better, resolution in a shorter conversion time. The master clock is used to derive only the M most significant bits and an additional mechanism is used to derive the remaining L least significant bits LSBs (with L equal or larger than N−M). The time required for the conversion is then:

$$T_{conversion} = 2^M \times T_{clock} + T_{phase\ detection}$$

where $T_{phase\ detection}$ is the time required to perform the phase detection. This conversion time is considerably smaller in the case where the time for phase detection can be limited (proportional to $2^L$ or scaling with L or fixed).

Figure 16:
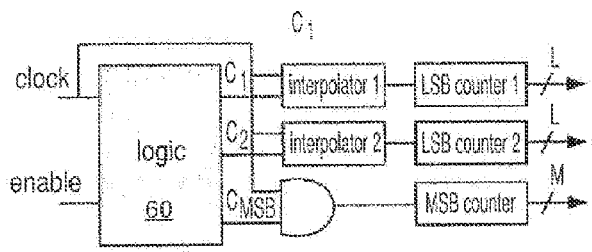
FIGS. 16 and 17 shows a scheme for increasing the conversion speed.
Figure 17:
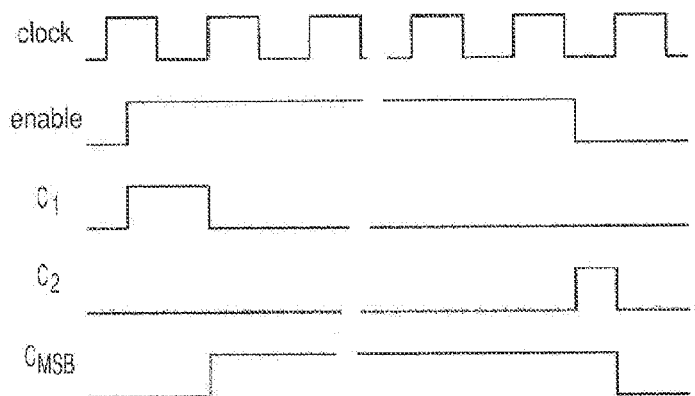

Advantageously, the additional mechanism is a phase detection method which detects the phase shift between the clock signal and an ENABLE signal, indicating the start or stop of the counter. In the present application, it is not essential to resolve the phase detection with absolute accuracy, good relative accuracy with good linearity is sufficient. Ideally, the phase detection is resolved with a resolution of $T_{clock}/2^L$ with L an integer value, but it is not mandatory. FIG. 16 schematically shows the overall apparatus and FIG. 17 shows a timing diagram for the operation of the apparatus. A clock signal and an enable signal are applied to logic 60. The clock signal is the signal CLK shown in FIG. 6 which is distributed to the parallel set of column processing units 30. The enable signal is generated by comparator 32 by comparing the ramp signal with the reset level and the signal level. The enable signal is asynchronous with respect to the clock, i.e. the start and end of the enable signal do not necessarily coincide with the cycles of the clock. Referring to FIG. 17, the total period that the enable signal is high is represented by the combination of $C_{MSB}$, $C_1$ and $C_2$. Pulsed signals $C_{MSB}$, $C_1$ and $C_2$ are generated by logic. The respective counters MSB counter, LSB counter 1, LSB counter 2 compute these respective parts of the overall time period. $C_{MSB}$ is synchronous with the main clock signal and indicates the number of complete clock cycles. $C_1$ and $C_2$ are pulses that are active high until the next rising edge of the clock signal following a rising/falling edge of the enable signal respectively. The main counter (MSB counter) counts the number of master clock cycles which occur during this time period. In FIG. 16 this is achieved by applying the clock signal and signal $C_{MSB}$ to an AND gate and outputting the resulting signal to the MSB counter. The clock signal and signal $C_1$ are applied to Interpolator 1, and the output of Interpolator 1 is applied to LSB counter 1. LSB counter 1 counts the fractions of a clock cycle which occur between the rising edge of the enable signal and the next rising edge of the clock signal. Similarly, the clock signal and signal $C_2$ are applied to Interpolator 2, and the output of Interpolator 2 is applied to LSB counter 2. LSB counter 2 counts the fractions of a clock cycle which occur between the falling edge of the enable signal and the next rising edge of the clock signal. The results of the measurements are combined to:

$$\text{Length of ENABLE pulse} = DN_{MSB} \times T_{clock} + (DN_1 - DN_2) \times T_{clock}/2^L$$

where $DN_x$ is the counter value of pulse x (x=MSB, 1, 2) and L the number of equivalent bits (LSBs) of the interpolators.

In the case where L is an integer value, the signal is a simple concatenation of the values (e.g. if $DN_{MSB}$ is '0110' and $DN_1$ is '1010', then the final value is '01101010').

Two interpolators are not always needed, such as when one of the edges of the enable signal is synchronous with the clock. It is possible to re-use the same interpolator to measure the $C_2$ pulse if the length of the enable signal is larger than the time the interpolator needs to convert the $C_1$ pulse. This is also possible when two ramp cycles are used for the analog-to-digital conversion operation. Three examples of implementation of the interpolation will now be described.

In FIG. 17 the pulses $C_1$ and $C_2$ are less than one clock cycle in duration, with the pulses ending with a rising edge of the next clock cycle. It is also possible to make the pulses $C_1$ and $C_2$, or at least one of these pulses, have a duration of at least one clock cycle. This can be useful to ensure that the value of the LSB counter is larger than zero, and serves a similar purpose as the intentional offset previously described. The rising edge of a clock cycle is used as an easily identifiable point of reference in FIG. 17, although it is possible to use any other identifiable feature of the clock cycle as an alternative to the rising edge. The example shown in FIG. 17 has an ENABLE signal which results from comparing a ramp signal against two analog signal levels. The position of each end of the ENABLE signal is asynchronous with respect to the clock and therefore both ends of the ENABLE signal need to be accurately measured. In a case where the ENABLE signal results from comparing a ramp signal against one analog signal level, such as an exposure level of a pixel, then the ENABLE signal can be arranged to start synchronously with the clock signal and it is only the end of the ENABLE signal which is asynchronous with respect to the clock signal. Thus, it is only necessary to accurately measure the end portion of the ENABLE signal.

Pulse Stretching

Figure 18:
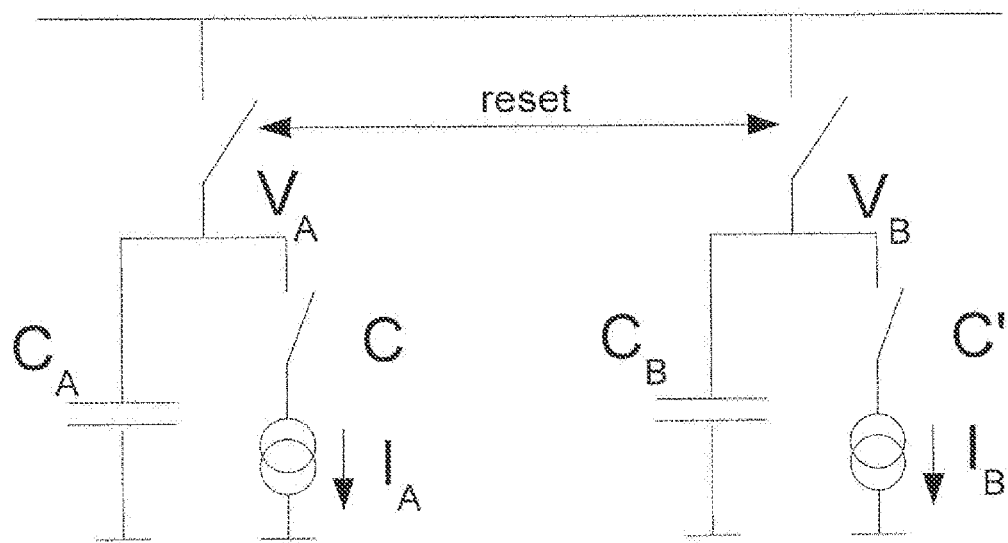
FIGS. 18 to 21 show a first way of implementing the scheme of FIG. 16.
Figure 19:
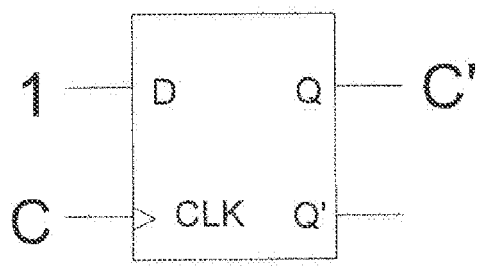
Figure 20:
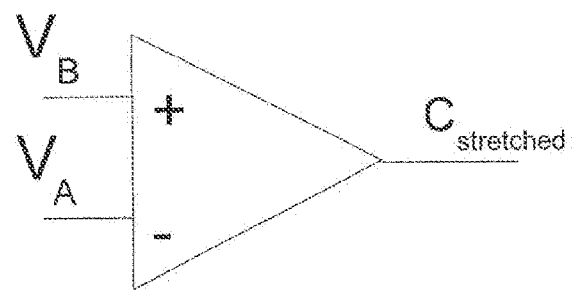
Figure 21A:
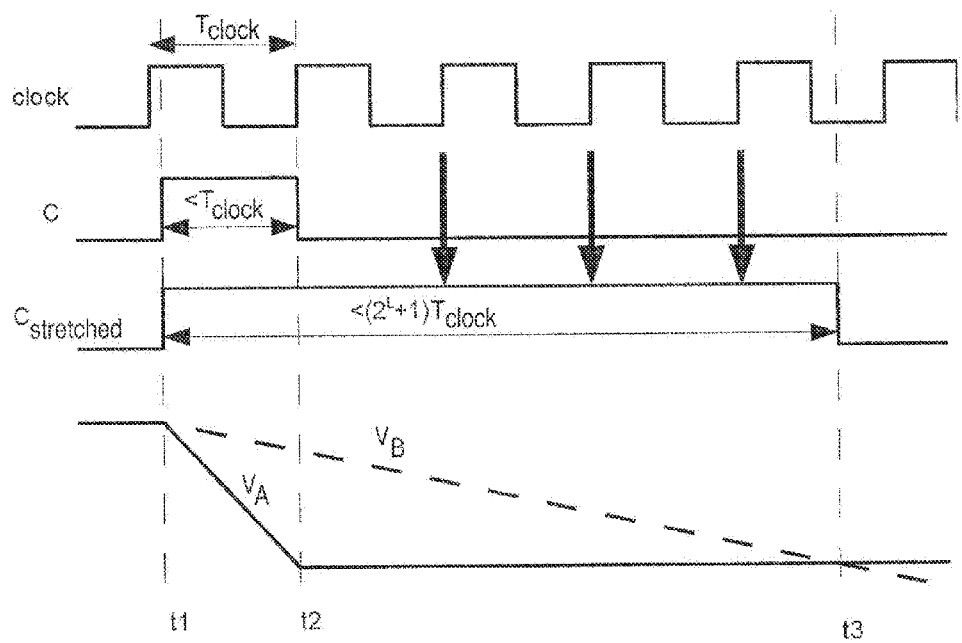
Figure 21B:
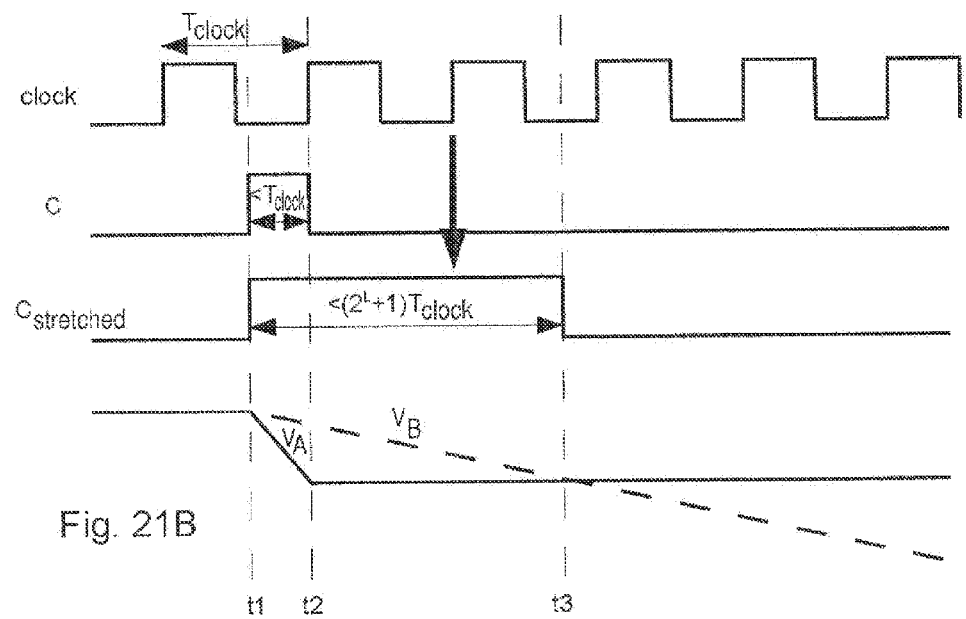

FIGS. 18-21 show a pulse stretching technique. FIG. 18 shows an arrangement of two capacitors $C_A$, $C_B$ used in the process. $V_A$ and $V_B$ are the respective voltages across the capacitors. FIG. 19 shows logic used to generate the signal C' in FIG. 18. FIG. 20 shows a comparator which generates a stretched pulse $C_{stretched}$ in response to the voltages $V_A$ and $V_B$. The resolution of the interpolator (L=number of LSBs) depends on the ratio of the capacitors and currents (L=2 in FIG. 18). In FIG. 21, pulse C represents $C_1$ or $C_2$ shown in FIG. 17, i.e. a pulse generated at a start or end of the enable signal which it is desired to measure. Pulse C has a width which is less than $T_{clock}$ The pulse stretching technique measures the length of pulse C by forming a stretched pulse $C_{stretched}$ and measuring the length of the stretched pulse by counting the number of clock cycles. At time t1 the enable signal goes high and pulse C also goes high. C' also goes high using the logic gate of FIG. 19. The switches shown in FIG. 18 are closed and this starts the discharge of capacitors $C_A$ and $C_B$. At the rising edge of the C, C', the current sources $I_A$ and $I_B$ are connected to the respective capacitors. The comparator shown in FIG. 20 compares voltages $V_A$ and $V_B$ and provides a high output as long as $V_B$ is above $V_A$. The discharge of $C_A$ is stopped at the end of pulse C (time t2). Since $V_A$ has decreased faster than $V_B$, signal C' remains high. When $V_B$ falls below $V_A$, at time t3, the output of the comparator goes low. One of the LSB counters counts the number of clock cycles falling within the length of pulse $C_{stretched}$. In this example (FIG. 21A) pulse $C_{stretched}$ has a length of three full clock cycles (after the C pulse) and if pulse C were equal to the length ($T_{clock}$) of a clock cycle, pulse $C_{stretched}$ would have a length of four clock cycles. Therefore, it is possible to deduce that C is at least three quarters of a clock cycle in length. In the example of FIG. 21B, pulse $C_{stretched}$ has a length of more than one full clock cycle (after the C pulse) since pulse C has a length of more than one quarter of the clock period.

FIGS. 18-21 show a simple way of performing the stretching, which should be easy to integrate with relatively good matching, but it will be appreciated that other techniques may exist.

Pulse Shrinking

Figure 22:
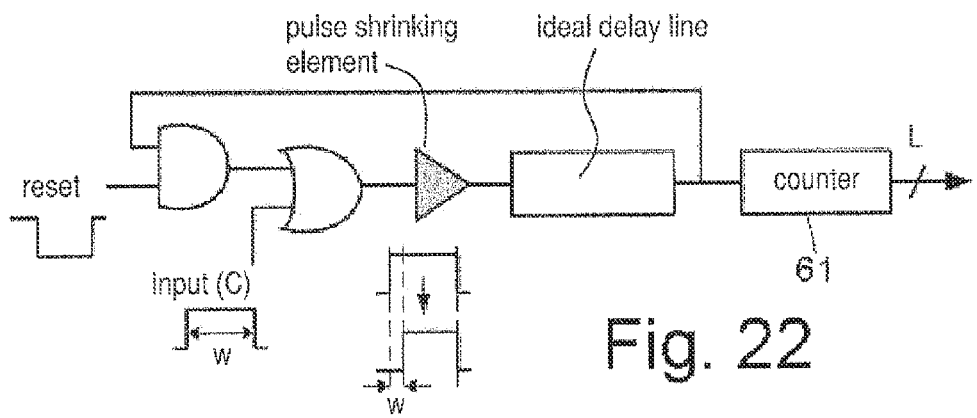
FIGS. 22 and 23 show a second way of implementing the scheme of FIG. 16.
Figure 23:
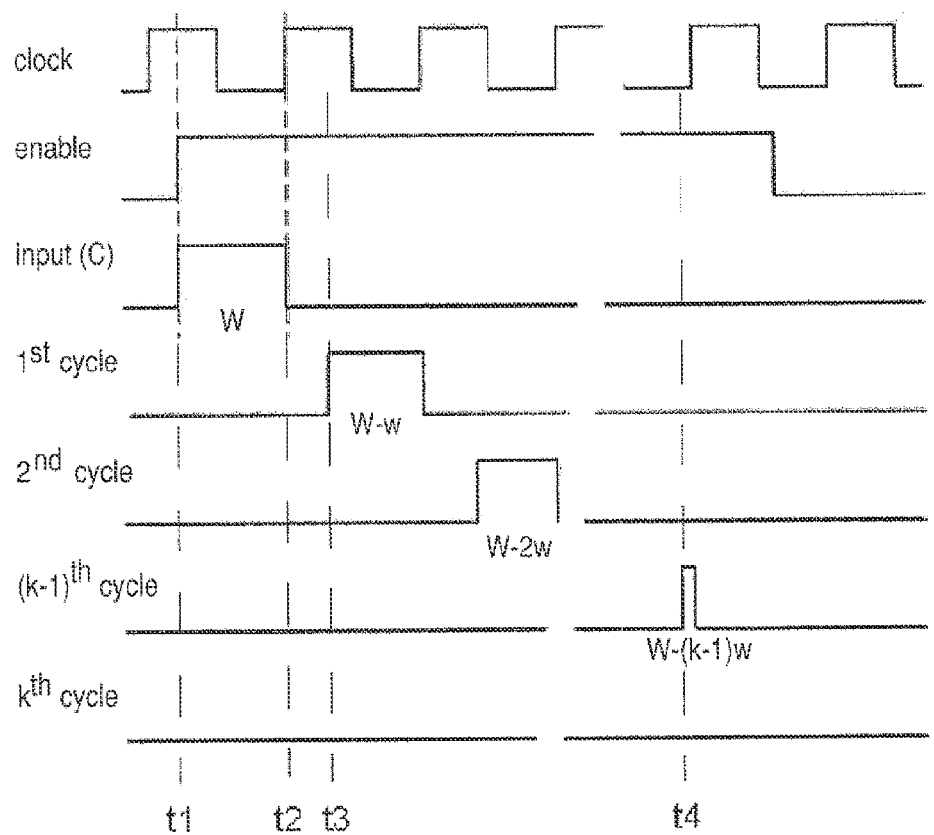
Figure 27:
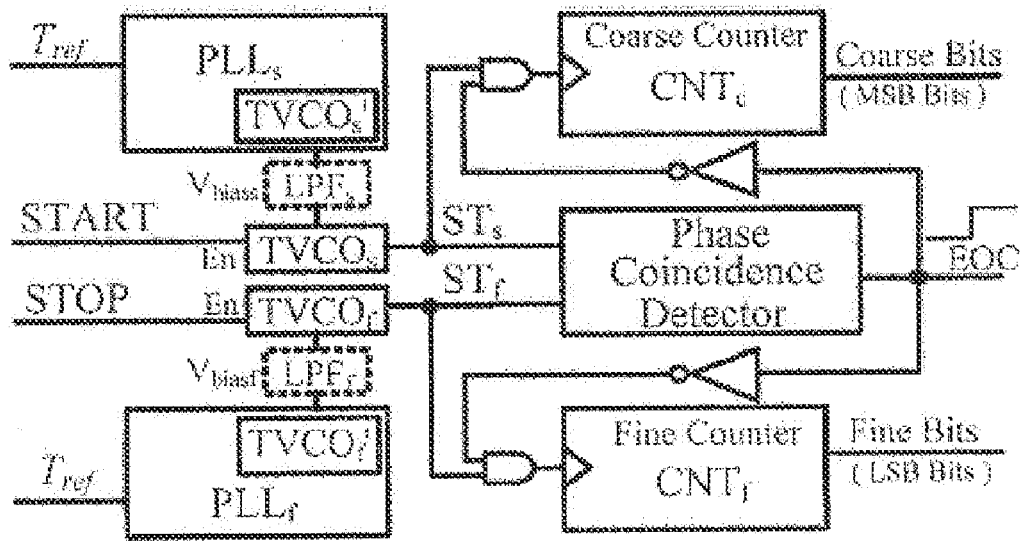

FIGS. 22 and 23 show another method to implement the interpolator. As before, a pulse C is generated between the start or fall of the enable signal and the rising edge of the next clock cycle. This will be called an input pulse because, in this embodiment, the input pulse is circulated around a delay loop. The delay loop includes a pulse shrinking element which has the function of reducing the length of the pulse during each cycle around the delay loop. The reduction in length is a constant w. The width W of the input pulse is then measured by counting the number of cycles before the pulse vanishes, with Length W=k×w.

In FIG. 23 it can be seen that the pulse C begins at time t1 and ends at time t2. At t3 a pulse of length W−w (original length minus constant w) is circulated around the loop. The length of the pulse is reduced by w after each cycle in the loop. Finally, at t4 in the (k−1)$^{th}$ loop cycle, the pulse appears for the last time and afterwards disappears completely. The pulse that is circulated around the loop is used as a clock input for a counter 61. The delay in the loop must be longer than the maximum width of the input pulse C. The technique is very easy to implement and consumes almost no power. The maximum conversion time for the interpolation is:

$$T_{conversion} = (T_{clock} + f) \times T_{clock}/w$$

Where f is the margin to make sure that the delay in the loop is larger than the maximal input width. To ease the combination of the value of the main counter and interpolator, the constant w should ideally be equal to $T_{clock}/2^L$, however, it is not mandatory.

Vernier Delay Line

Another way to achieve the sub-clock timing resolution without the use of a high speed clock is to use techniques based on the Vernier principle. FIG. 24 shows two delay lines with a small (defined) difference in delay are used for time resolving. The start signal, which corresponds to the rising edge of pulse $C_1$ or $C_2$ shown in FIG. 17 is fed into a delay line with a propagation delay of $T_s$. Slightly later, the stop signal is fed into a second delay line with a shorter propagation delay $T_f$. The stop signal is synchronous with the master clock. Since the stop signal propagates faster, it will catch up with the start signal and the latched outputs of the flip-flops will be toggled from 0 to 1 from then on (thermometer code). The effective time resolution is the delay propagation difference ($T_s-T_f$). FIG. 25 shows the corresponding timing diagram.

Note that one can also make reference to a previous rising clock edge by swapping the delay lines. Instead of a linear delay line one can also work with two ring oscillators with slightly different delays. To compensate for, or reduce, the influence of temperature and process variation, the oscillators could be voltage controlled oscillators (VCOs) which are controlled by reference phase-locked loops (PLLs) having a copy of the corresponding VCO, and deduced from a signal clock. FIG. 26 is taken from the paper "A deep sub-micron Timing Measurement Circuit using a Single-Stage Vernier Delay Line", Chan et al, IEEE Custom Integrated Circuits Conference pp. 77-80.

Figure 28:
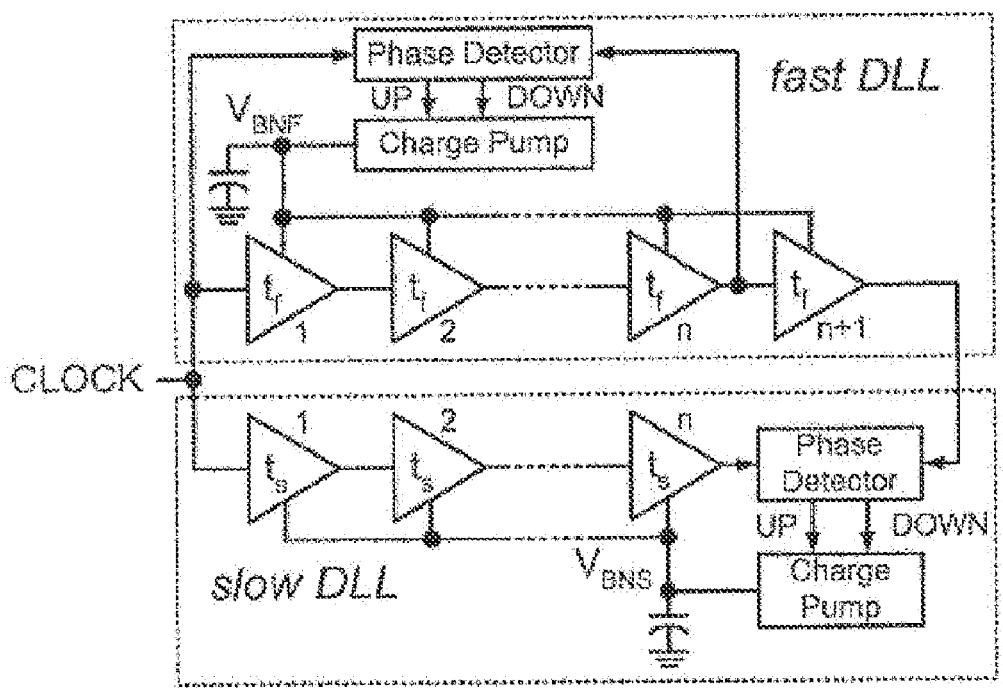

Similarly, the delay lines could be controlled by DLL or in case of the Vernier based technique a dual DLL (course counting by master clock, fine counting by latching the status of the VCO or through Vernier line (from the paper "A High-Precision Time-to-Digital Converter Using a Two-Level Conversion Scheme", Hwang et al, IEEE Transcations on Nuclear Science, Vol. 51, No. 4, August 2004, pp. 1349-1352.) FIG. 28 below shows how the delay lines can be controlled by a dual DLL. Both of the papers cited above (Chan, Hwang) are in the field of Time-to-Digital Converters (TDC). TDC is a technique to measure time intervals, and has been applied to particle life time detection in particle physics, measuring on-chip clock jitter measurements, laser range finders, thickness measurements, phase meters, automatic test equipment.

Figure 29:
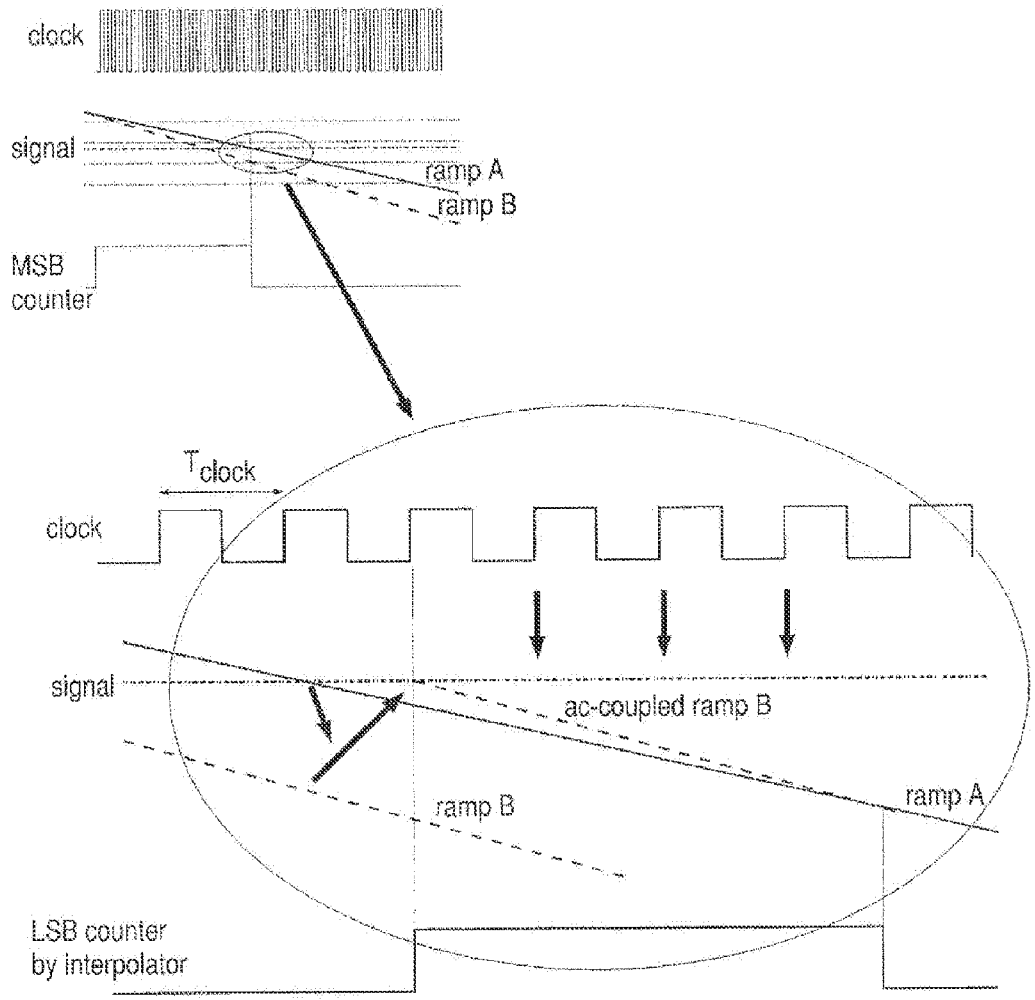

FIG. 29 shows another way of implementing the Vernier principle. RampA is used for the general conversion (see figure top, giving the MSBs). When rampA crosses the signal, at a reference point after that, rampA signal is compared to an ac-coupled rampB which has a slightly steeper slope (the ac coupling makes the rampB signal start at the signal level at the reference point). In FIG. 29 rampB has slope 4/3 compared to rampA slope (resulting in 2 LSB bits). In this case, the time between rampA crossing the signal and the reference point (start of ac coupled rampB) is larger than ¾ of the clock cycle, hence the LSB counter counts three clock cycles (shown by the downward arrows).

Figure 30:
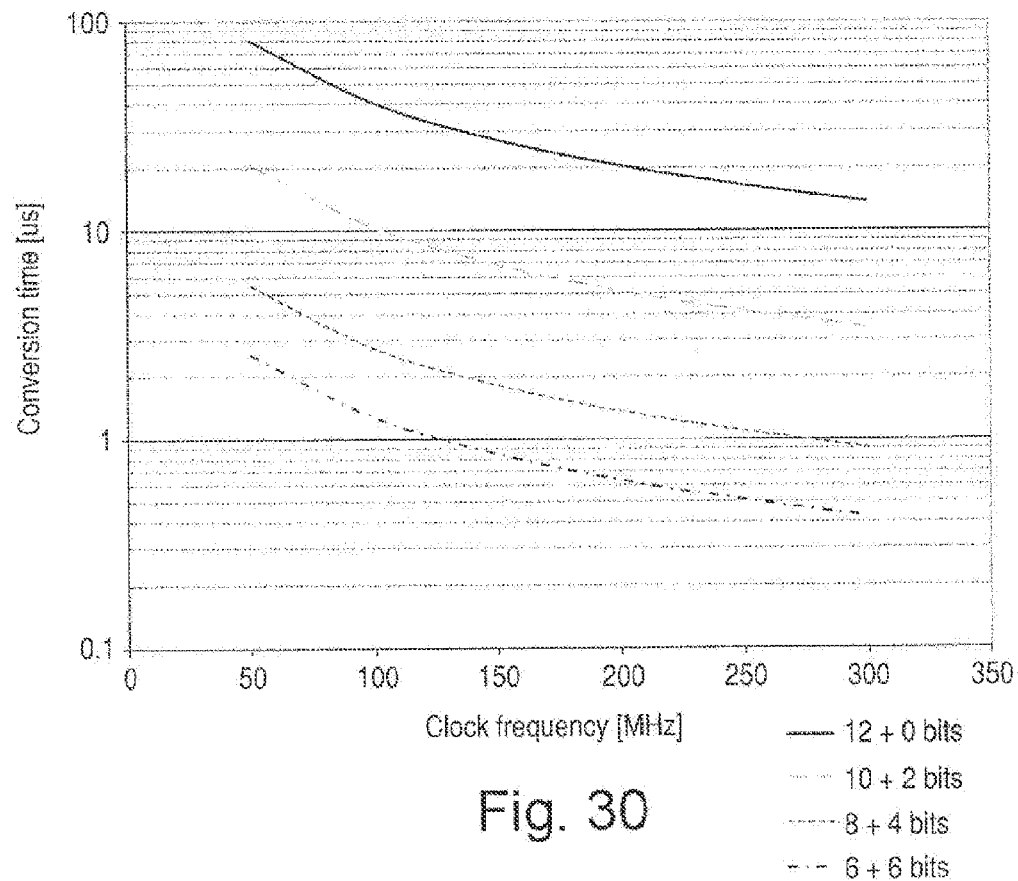
FIG. 30 shows a comparison of conversion times using the techniques of FIGS. 16-29.

FIG. 30 illustrates how the conversion time can be reduced using one of the interpolation techniques shown in FIGS. 16-29. It is assumed that 12 bit resolution is required. FIG. 30 shows the estimated conversion time required for a single measurement (extra overhead for double sampling or CDS not taken into account) for different combinations of coarse and fine (interpolation) bits.

Figure 31:
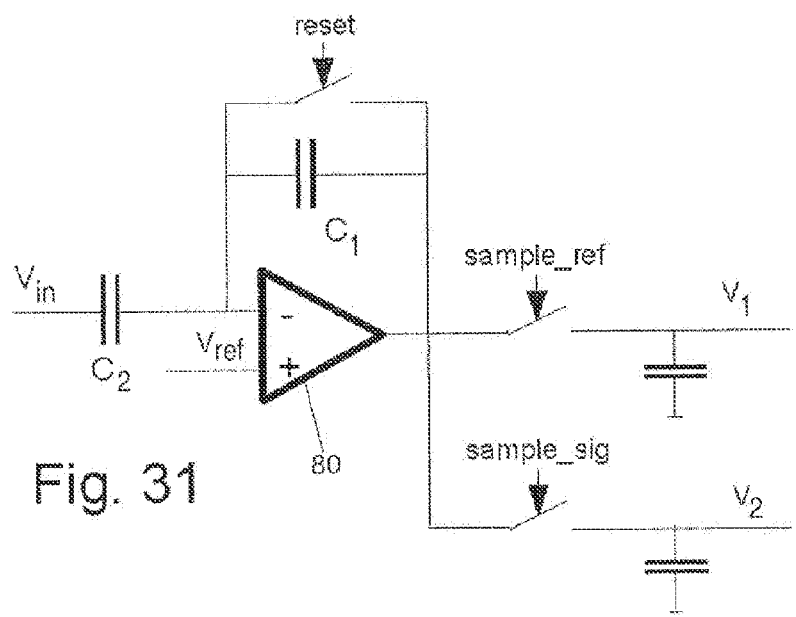
FIG. 31 shows an input circuit for any one of the embodiments of the conversion apparatus.

In each of the aspects of the invention described above the converter receives two analog input signals and outputs a digital value which is the difference between those input signals. The input signals have been described as the pixel signals $V_{reset}, V_{sig}$ but there are other possibilities for the input signals. In one alternative, one of the analog input signals is the quantity ($V_{reset}, V_{sig}$), a scaled version of this quantity, or this quantity with an offset, and the second of the analog input signals is a reference signal. This can be useful for various reasons, such as to change the offset level of the input signals to match the ADC input range or to add gain on the signal, which can be useful for noise performance. FIG. 31 shows an input circuit which can be used with a converter of any one of the previously described embodiments. $V_{reset}$ and $V_{sig}$ are sequentially applied as the input signal $V_{in}$ of differential amplifier 80. When $V_{reset}$ is applied as the signal $V_{in}$, the reset switch in the feedback loop is closed. At the output of the amplifier 80, the signal value is equal to $V_{ref}+V_{offset}$ of the amplifier. This value is sampled by a switch on a first sample capacitor after the reset switch is released and forms signal $V_1$. This also samples the kTC noise of the capacitive amplifier. Then, the pixel (light-induced) signal $V_{sig}$ is applied to the input. The output signal level of the amplifier will then become approximately $V_{ref}+V_{offset}+C2/C1*(V_{reset}-V_{sig})$, if kTC noise contribution is neglected. This is sampled on the other capacitor, and becomes analog signal $V_2$. The two signals on the capacitors are then used as the two signal inputs to the ADC. Typically, the non-uniformity of $V_{offset}$ between columns is made much smaller than $V_{reset}$ non-uniformity between pixels, so this circuit also performs a first analog FPN (fixed pattern noise) correction and this can also reduce the ramp swing for the reference conversion.

The invention is not limited to the embodiments described herein, which may be modified or varied without departing from the scope of the invention.

The invention claimed is:

1. An analog-to-digital converter for generating an output digital value equivalent to the difference between two analog signal values comprising:
    at least one input for receiving a first analog signal level and a second analog signal level;
    an input for receiving a ramp signal;
    a counter which is operable to count in a single direction;
    a control stage which is arranged to enable the counter based on a comparison of the ramp signal with the first analog signal and the second analog signal;
    an output for outputting a value accumulated by the counter during a period when it is enabled;
    wherein the control stage is arranged to accumulate digital signal values for elements of an image over multiple exposure periods and is further arranged to begin the counter at a starting digital value which represents a previously accumulated exposure level for an element of the image.

2. An analog-to-digital converter according to claim 1 further comprising a connection to a memory, and wherein the control stage is further arranged to:
    read a digital value from the memory at the beginning of a processing operation for an exposure period, which digital value represents a previously accumulated exposure level of an element of the image;
    output a digital value to the memory at the end of a processing operation for an exposure period, which digital value represents a new accumulated exposure level of the element of the image.

3. An analog-to-digital converter according to claim 1 wherein the control stage is arranged to determine whether to enable the counter based on the accumulated exposure level for an element of the image.

4. An analog-to-digital converter according to claim 3 wherein the control stage is arranged to make an independent determination of whether to enable the counter for each element of the image.

5. An analog-to-digital converter according to claim 1 wherein the control stage is arranged to use a dedicated counter to accumulate the digital signal value for a particular element of the image across the multiple exposure periods.

6. An analog-to-digital converter according to claim 1 wherein the pixel array is operable to perform time delay integration (TDI) and each exposure period is a TDI cycle.

* * * * *